(12) United States Patent
Kwon et al.

(10) Patent No.: US 12,342,709 B2
(45) Date of Patent: Jun. 24, 2025

(54) DISPLAY APPARATUS HAVING A TOUCH SENSING LAYER WITH A REFLECTION-ADJUSTING LAYER

(71) Applicant: Samsung Display Co., Ltd., Yongin-si (KR)

(72) Inventors: Ohjeong Kwon, Yongin-si (KR); Seungyeon Jeong, Yongin-si (KR); Hyeoji Kang, Yongin-si (KR); Taeho Kim, Yongin-si (KR); Mihwa Lee, Yongin-si (KR); Hongyeon Lee, Yongin-si (KR); Sunggyu Jang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/486,045

(22) Filed: Oct. 12, 2023

(65) Prior Publication Data
US 2024/0147821 A1    May 2, 2024

(30) Foreign Application Priority Data
Oct. 17, 2022   (KR) .................... 10-2022-0133613

(51) Int. Cl.
*H10K 59/80*    (2023.01)
*G06F 3/044*    (2006.01)
(Continued)

(52) U.S. Cl.
CPC ....... *H10K 59/8792* (2023.02); *G06F 3/0445* (2019.05); *G09G 3/3233* (2013.01);
(Continued)

(58) Field of Classification Search
CPC .................................................. H10K 59/8792
(Continued)

(56) References Cited

U.S. PATENT DOCUMENTS 10,510,810 B2   12/2019   Kim et al.
10,971,557 B2   4/2021    Jeong et al.
(Continued)

FOREIGN PATENT DOCUMENTS

CN      112885972 A      6/2021
KR   10-2018-0082661 A   7/2018
(Continued)

*Primary Examiner* — Long D Pham
(74) *Attorney, Agent, or Firm* — Womble Bond Dickinson (US) LLP

(57) ABSTRACT

A display apparatus includes a first light-emitting element implementing a first emission area, a second light-emitting element implementing a second emission area, a low reflection layer on the first light-emitting element and the second light-emitting element, a first touch insulating layer including a first opening overlapping the second emission area, and a second touch insulating layer including a second opening overlapping the first opening, a light-blocking layer on the touch sensing layer and including a third opening corresponding to the first emission area and a fourth opening corresponding to the second emission area, and a reflection-adjusting layer wherein a refractive index of the reflection-adjusting layer is higher than a refractive index of the second touch insulating layer.

20 Claims, 18 Drawing Sheets

(51) Int. Cl.
  *G09G 3/3233* (2016.01)
  *H10K 59/122* (2023.01)
  *H10K 59/40* (2023.01)

(52) U.S. Cl.
  CPC ........... *H10K 59/122* (2023.02); *H10K 59/40* (2023.02); *G06F 2203/04112* (2013.01); *G09G 2300/0842* (2013.01)

(58) Field of Classification Search
  USPC ......................................................... 345/174
  See application file for complete search history.

(56) References Cited

U.S. PATENT DOCUMENTS

| 11,010,007 | B2 | 5/2021 | Lee et al. |
| 2020/0295310 | A1* | 9/2020 | Moon ................ H10K 59/1315 |
| 2021/0263605 | A1 | 8/2021 | Kim et al. |
| 2022/0028932 | A1* | 1/2022 | Lee ....................... H10K 59/40 |
| 2022/0059805 | A1 | 2/2022 | Cho et al. |
| 2022/0199949 | A1 | 6/2022 | Jung et al. |
| 2022/0238848 | A1 | 7/2022 | Kwon et al. |
| 2022/0285655 | A1 | 9/2022 | Lee et al. |
| 2022/0293890 | A1 | 9/2022 | Jeong et al. |
| 2023/0086323 | A1 | 3/2023 | Kwon et al. |
| 2023/0105374 | A1 | 4/2023 | Jeong et al. |
| 2023/0112955 | A1 | 4/2023 | Lee et al. |

FOREIGN PATENT DOCUMENTS

| KR | 10-2020-0101549 A | 8/2020 |
| KR | 10-2021-0106611 A | 8/2021 |
| KR | 10-2022-0023284 A | 3/2022 |
| KR | 10-2022-0087619 A | 6/2022 |
| KR | 10-2022-0108287 A | 8/2022 |
| KR | 10-2022-0125903 A | 9/2022 |
| KR | 10-2022-0129139 A | 9/2022 |
| KR | 10-2023-0041913 A | 3/2023 |
| KR | 10-2023-0049815 A | 4/2023 |
| KR | 10-2023-0049816 A | 4/2023 |

* cited by examiner

DISPLAY APPARATUS HAVING A TOUCH SENSING LAYER WITH A REFLECTION-ADJUSTING LAYER

CROSS-REFERENCE TO RELATED APPLICATION

The present application claims priority to and the benefit of Korean Patent Application No. 10-2022-0133613, filed on Oct. 17, 2022, in the Korean Intellectual Property Office, the entire disclosure of which is incorporated herein by reference.

BACKGROUND

1. Field

Aspects of one or more embodiments relate to a display apparatus.

2. Description of the Related Art

Because organic light-emitting display apparatuses have self-luminous characteristics and, as opposed to liquid crystal display apparatuses, do not require a separate light source, the thickness and weight of the organic light-emitting display apparatuses may be relatively reduced. In addition, organic light-emitting display apparatuses have relatively high-quality characteristics such as relatively low power consumption, relatively high brightness, relatively high response speeds, and the like.

The above information disclosed in this Background section is only for enhancement of understanding of the background and therefore the information discussed in this Background section does not necessarily constitute prior art.

SUMMARY

Aspects of one or more embodiments relate to a display apparatus, and for example, to a display apparatus with relatively improved visibility.

A display apparatus in some alternative systems may have reduced or impaired visibility due to external light reflection.

According to some embodiments, a display apparatus may have relatively improved visibility by including a low reflection layer and a reflection-adjusting layer on a display element. However, such characteristics are merely examples, and embodiments according to the present disclosure are not limited thereto.

Additional aspects will be set forth in part in the description which follows and, in part, will be apparent from the description, or may be learned by practice of the presented embodiments of the disclosure.

According to one or more embodiments, a display apparatus includes a first light-emitting element on a substrate and implementing a first emission area by emitting light in a first wavelength band, a second light-emitting element on the substrate and implementing a second emission area by emitting light in a second wavelength band that is different from the first wavelength band, a low reflection layer on the first light-emitting element and the second light-emitting element and including an inorganic material, a touch sensing layer on the low reflection layer and including a first touch electrode layer, a second touch electrode layer, a first touch insulating layer, and a second touch insulating layer, wherein the first touch insulating layer is located between the first touch electrode layer and the second touch electrode layer and includes a first opening overlapping the second emission area, and the second touch insulating layer is on the second touch electrode layer and includes a second opening overlapping the first opening, a light-blocking layer on the touch sensing layer and including a third opening corresponding to the first emission area and a fourth opening corresponding to the second emission area, and a reflection-adjusting layer on the light-blocking layer, wherein a refractive index of the reflection-adjusting layer is higher than a refractive index of the second touch insulating layer.

According to some embodiments, the first light-emitting element may be configured to emit red light.

According to some embodiments, the first touch insulating layer may be configured to selectively transmit the light in the first wavelength band.

According to some embodiments, the reflection-adjusting layer may fill the first opening and the second opening.

According to some embodiments, a difference between the refractive index of the reflection-adjusting layer and the refractive index of the second touch insulating layer may be 0.1 or more.

According to some embodiments, the refractive index of the second touch insulating layer may be 1.5 or less, and the refractive index of the reflection-adjusting layer may be 1.6 or more.

According to some embodiments, the reflection-adjusting layer may include dye, pigment, or a combination thereof.

According to some embodiments, the first light-emitting element may include a first pixel electrode, the second light-emitting element may include a second pixel electrode, the display apparatus may further include a pixel-defining layer covering edges of the first pixel electrode and the second pixel electrode and defining a first pixel opening corresponding to the first emission area and a second pixel opening corresponding to the second emission area, and the pixel-defining layer may include a light-blocking material.

According to some embodiments, a width of the first opening may be greater than a width of the second pixel opening, and a first distance between a boundary of the first opening and a boundary of the second pixel opening may be 2 μm or less.

According to some embodiments, a width of the first opening may be less than or equal to a width of the second pixel opening, and a second distance between a boundary of the first opening and a boundary of the second pixel opening may be 1 μm or less.

According to some embodiments, a lateral surface of the first touch insulating layer defining the first opening may have a slope of about 70° to about 88° with respect to an upper surface of the substrate.

According to one or more embodiments, a display apparatus includes a first light-emitting element located over a substrate and implementing a first emission area by emitting light in a first wavelength band, a second light-emitting element over the substrate and implementing a second emission area by emitting light in a second wavelength band that is different from the first wavelength band, a low reflection layer on the first light-emitting element and the second light-emitting element and including an inorganic material, a touch sensing layer on the low reflection layer and including a first touch electrode layer, a second touch electrode layer, and a touch insulating layer, wherein the touch insulating layer is located between the first touch electrode layer and the second touch electrode layer and includes a first opening overlapping the second emission area, a light-blocking layer on the touch sensing layer and including a second opening corresponding to the first emission area and a third opening corresponding to the second emission area, and a reflection-adjusting layer on the light-blocking layer wherein a refractive index of the reflection-adjusting layer is higher than a refractive index of the touch insulating layer.

According to some embodiments, the first light-emitting element may be configured to emit red light.

According to some embodiments, the touch insulating layer may be configured to selectively transmit the light in the first wavelength band.

According to some embodiments, a difference between the refractive index of the reflection-adjusting layer and the refractive index of the touch insulating layer may be 0.1 or more.

According to some embodiments, the reflection-adjusting layer may include dye, pigment, or a combination thereof.

According to some embodiments, the first light-emitting element may include a first pixel electrode, the second light-emitting element may include a second pixel electrode, the display apparatus may further include a pixel-defining layer covering edges of the first pixel electrode and the second pixel electrode and defining a first pixel opening corresponding to the first emission area and a second pixel opening corresponding to the second emission area, and the pixel-defining layer may include a light-blocking material.

According to some embodiments, a width of the first opening may be greater than a width of the second pixel opening, and a first distance between a boundary of the first opening and a boundary of the second pixel opening may be 2 μm or less.

According to some embodiments, a width of the first opening may be less than or equal to a width of the second pixel opening, and a second distance between a boundary of the first opening and a boundary of the second pixel opening may be 1 μm or less.

According to some embodiments, a lateral surface of the touch insulating layer defining the first opening may have a slope of about 70° to about 88° with respect to an upper surface of the substrate.

These and/or other aspects will become more apparent and more readily appreciated from the following detailed description of the embodiments, the accompanying drawings, and claims.

BRIEF DESCRIPTION OF THE DRAWINGS

The above and other aspects, features, and characteristics of certain embodiments of the disclosure will be more apparent from the following description taken in conjunction with the accompanying drawings, in which.

DETAILED DESCRIPTION

Figure 1:
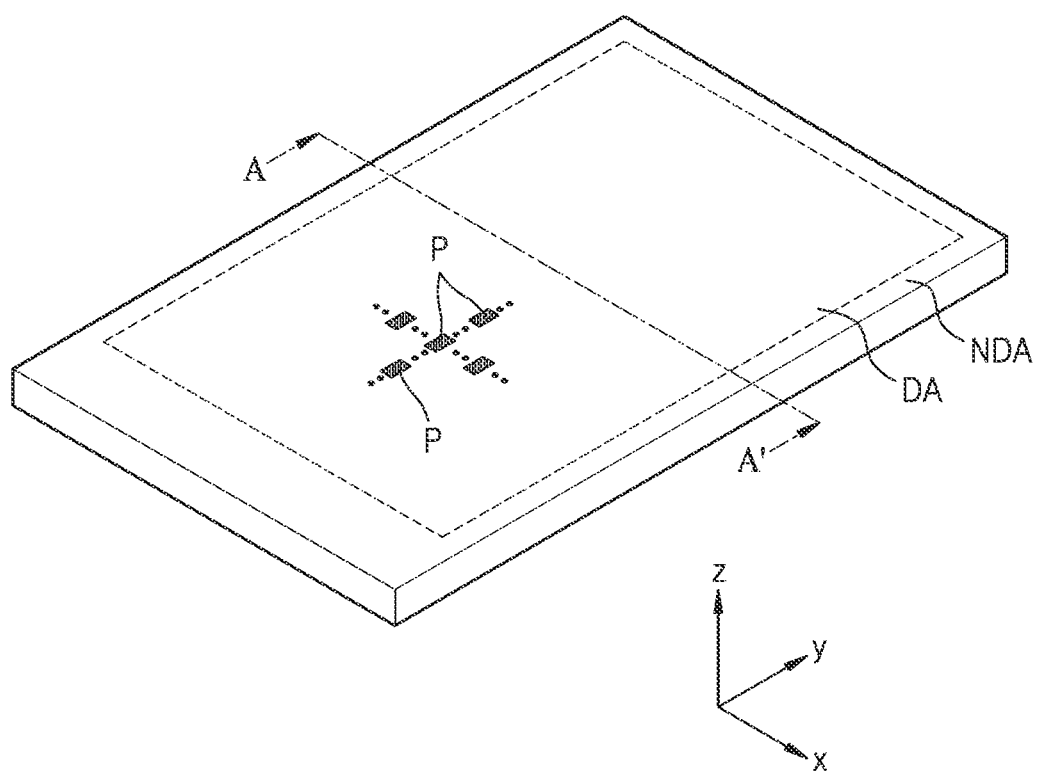
FIG. 1 is a schematic perspective view of a display apparatus according to some embodiments.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the disclosure allows for various changes and numerous embodiments, certain embodiments will be illustrated in the drawings and described in the written description. Effects and features of the disclosure, and methods for achieving them will be clarified with reference to embodiments described below in detail with reference to the drawings. However, embodiments according to the present disclosure are not limited to the following embodiments and may be embodied in various forms.

Hereinafter, embodiments will be described with reference to the accompanying drawings, wherein like reference numerals refer to like elements throughout and a repeated description thereof is omitted.

While such terms as "first" and "second" may be used to describe various elements, such elements must not be limited to the above terms. The above terms are used to distinguish one element from another.

The singular forms "a," "an," and "the" as used herein are intended to include the plural forms as well unless the context clearly indicates otherwise.

It will be understood that the terms "comprise," "comprising," "include" and/or "including" as used herein specify the presence of stated features or elements but do not preclude the addition of one or more other features or elements.

It will be further understood that, when a layer, region, or element is referred to as being "on" another layer, region, or element, it can be directly or indirectly on the other layer, region, or element. That is, for example, intervening layers, regions, or elements may be present.

It will be understood that when a layer, region, or element is referred to as being "connected" to another layer, region, or element, it may be "directly connected" to the other layer, region, or element or may be "indirectly connected" to the other layer, region, or element with other layer, region, or element interposed therebetween. For example, it will be understood that when a layer, region, or element is referred to as being "electrically connected" to another layer, region, or element, it may be "directly electrically connected" to the other layer, region, or element or may be "indirectly electrically connected" to other layer, region, or element with other layer, region, or element located therebetween.

In the present specification, "A and/or B" means A or B, or A and B. In the present specification, "at least one of A and B" means A or B, or A and B.

The x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

In the case where a certain embodiment may be implemented differently, a specific process order may be performed in the order different from the described order. As an example, two processes successively described may be simultaneously performed substantially and performed in the opposite order.

Sizes of elements in the drawings may be exaggerated or reduced for convenience of explanation. As an example, the size and thickness of each element shown in the drawings are arbitrarily represented for convenience of description, and thus, embodiments according to the present disclosure are not necessarily limited thereto.

FIG. 1 is a schematic perspective view of a display apparatus 1 according to some embodiments.

Referring to FIG. 1, the display apparatus 1 according to some embodiments includes a display area DA and a non-display area NDA outside the display area DA. Though it is shown in FIG. 1 that the display area DA has an approximately rectangular shape, the embodiments according to the present disclosure are not limited thereto. The display area DA may have various shapes such as circles, ellipses, polygons, and the like.

The display area DA is a portion that displays images, and a plurality of pixels P may be arranged in the display area DA. Hereinafter, a "pixel" in this specification may mean a "sub-pixel". Each pixel P may include a light-emitting element such as an organic light-emitting diode OLED. Each pixel P may be configured to emit, for example, red, green, blue, or white light.

The display area DA may be configured to display preset images by using light emitted from pixels P. In the present specification, as described above, a pixel P may be defined as an emission area that emits one of red, green, blue, and white light.

The non-display area NDA is a region in which pixels P are not arranged and may be a region that does not display images. A power supply line, a printed circuit board, or a terminal part may be arranged in the non-display area NDA, wherein the power supply line drives pixels P, the printed circuit board includes a driving circuit part, and a driver integrated circuit (IC) is connected to the terminal part.

Hereinafter, an organic light-emitting display apparatus is described as an example of the display apparatus 1 according to some embodiments. However, the display apparatus 1 according to some embodiments is not limited thereto. The display apparatus 1 according to some embodiments may be an inorganic light-emitting display apparatus or a quantum-dot light-emitting display apparatus. As an example, an emission layer of a light-emitting element of the display apparatus 1 may include an organic material or an inorganic material. In addition, quantum dots may be located on a path of light emitted from the emission layer.

In addition, the display apparatus 1 according to some embodiments is applicable to various products including televisions, notebook computers, monitors, advertisement boards, Internet of things (IoTs) apparatuses as well as portable electronic apparatuses including mobile phones, smartphones, tablet personal computers (PCs), mobile communication terminals, electronic organizers, electronic books, portable multimedia players (PMPs), navigations, and ultra mobile personal computers (UMPCs). In addition, the display apparatus 1 according to some embodiments is applicable to wearable devices including smartwatches, watchphones, glasses-type displays, and head-mounted displays (HMDs). In addition, according to some embodiments, the display apparatus 1 is applicable to a display screen in instrument panels for automobiles, center fascias for automobiles, or center information displays (CIDs) arranged on a dashboard, room mirror displays that replace side mirrors of automobiles, and displays of an entertainment system arranged on the backside of front seats for backseat passengers in automobiles.

Figure 2:
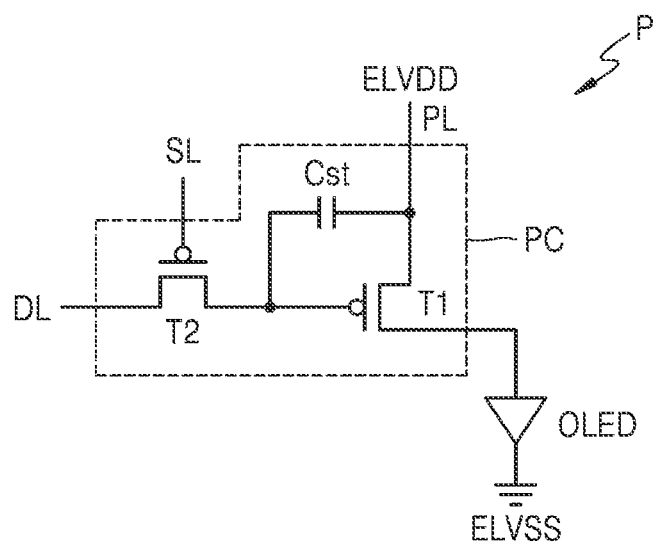
FIG. 2 is a schematic circuit diagram of a display element and a pixel circuit connected thereto provided to a pixel of a display apparatus according to some embodiments.

FIG. 2 is a schematic circuit diagram of a display element and a pixel circuit connected thereto provided to a pixel of the display apparatus 1 according to some embodiments.

Referring to FIG. 2, an organic light-emitting diode OLED, which is a display element, is connected to a pixel circuit PC. The pixel circuit PC may include a first thin-film transistor T1, a second thin-film transistor T2, and a storage capacitor Cst. The organic light-emitting diode OLED may emit, for example, red, green, or blue light, or emit red, green, blue, or white light.

The second thin-film transistor T2 is a switching thin-film transistor, may be connected to a scan line SL and a data line DL, and configured to transfer a data voltage to the first thin-film transistor T1 according to a switching voltage, the data voltage being input from the data line DL, and the switching voltage being input from the scan line SL. The storage capacitor Cst may be connected to the second thin-film transistor T2 and a driving voltage line PL and configured to store a voltage corresponding to a difference between a voltage transferred from the second thin-film transistor T2 and a first power voltage ELVDD supplied to the driving voltage line PL.

The first thin-film transistor T1 is a driving thin-film transistor, may be connected to the driving voltage line PL and the storage capacitor Cst, and configured to control a driving current according to the voltage stored in the storage capacitor Cst, the driving current flowing from the driving voltage line PL to the organic light-emitting diode OLED. The organic light-emitting diode OLED may emit light having a preset brightness corresponding to the driving current. An opposite electrode (e.g., a cathode) of the organic light-emitting diode OLED may receive a second power voltage ELVSS.

Though it is shown in FIG. 2 that the pixel circuit PC includes two thin-film transistors and one storage capacitor, the number of thin-film transistors or the number of storage capacitors may be variously changed depending on the design of the pixel circuit PC.

Figure 3:
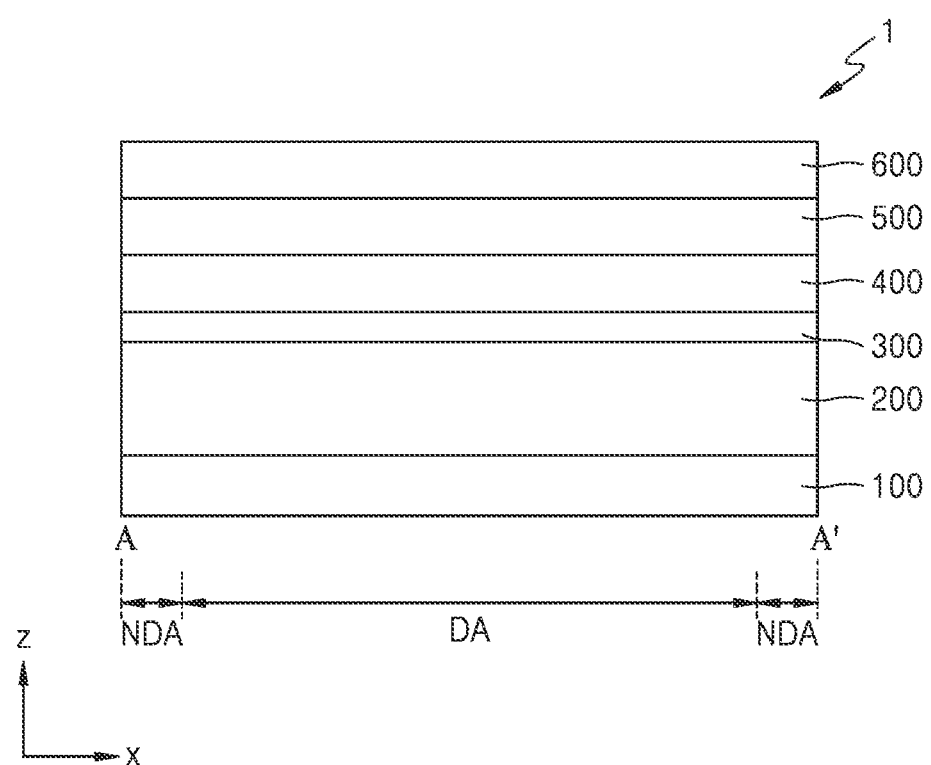
FIG. 3 is a schematic cross-sectional view of a display apparatus according to some embodiments.

FIG. 3 is a schematic cross-sectional view of the display apparatus 1 according to some embodiments. FIG. 3 is a cross-sectional view of the display apparatus 1, taken along the line A-A' of the display apparatus 1 shown in FIG. 1.

Referring to FIG. 3, the display apparatus 1 according to some embodiments may include a substrate 100, a display layer 200, a low reflection layer 300, a thin-film encapsulation layer 400, a touch sensing layer 500, an anti-reflection layer 600, and a cover window CW.

The substrate 100 may include glass or a polymer resin. As an example, the polymer resin may include polyethersulfone, polyacrylate, polyetherimide, polyethylene naphthalate, polyethylene terephthalate, polyphenylene sulfide, polyarylate, polyimide, polycarbonate, cellulose acetate propionate, or the like. The substrate 100 including the polymer resin may be flexible, rollable, or bendable. The substrate 100 may have a multi-layered structure including a layer that includes a polymer resin and an inorganic layer.

The display layer 200 may include an organic light-emitting diode, a pixel circuit, and insulating layers therebetween, the organic light-emitting diode being a display element, and the pixel circuit being electrically connected to the organic light-emitting diode. In addition, the display layer 200 may include scan lines, data lines, power lines, and the like connected to the pixel circuit, a scan driver, fan-out wirings, and the like, wherein the scan driver is configured to apply scan signals to the scan lines, and the fan-out wirings connect the data lines to a display driver.

The low reflection layer 300 may be located on the display layer 200, and the thin-film encapsulation layer 400 may be located on the low reflection layer 300. As an example, the display layer 200 and the low reflection layer 300 may be sealed by the thin-film encapsulation layer 400. The thin-film encapsulation layer 400 may include at least one inorganic encapsulation layer and at least one organic encapsulation layer. Because the organic encapsulation layer provides a more flattened base surface, even though the touch sensing layer 500 described later is formed by a continuous process, a defect rate may be reduced.

The touch sensing layer 500 may be located on the thin-film encapsulation layer 400. The touch sensing layer 500 may sense an external input, for example, a touch of an object such as a finger or a stylus pen, and the display apparatus 1 may obtain coordinate information corresponding to the touched position. The touch sensing layer 500 may include a touch electrode and trace lines connected to the touch electrode. According to some embodiments, an operating method of the touch sensing layer 500 is not particularly limited. As an example, the touch sensing layer 500 may be configured to sense an external input by using a mutual capacitive method or a self-capacitive method.

The touch sensing layer 500 may be located on the thin-film encapsulation layer 400. According to some embodiments, the touch sensing layer 500 may be directly located on the thin-film encapsulation layer 400. In the present specification, when "A is directly located on B", it means that a separate adhesive layer or adhesive member is not present between the construction of A and the construction of B. After the construction of A is formed, the construction of B may be formed on a base surface provided by the construction of A by a successive process. Alternatively, the touch sensing layer 500 may be separately formed and then bonded to the thin-film encapsulation layer 400 through an adhesive layer such as an optically clear adhesive.

The anti-reflection layer 600 may be located on the touch sensing layer 500. The anti-reflection layer 600 may reduce reflectivity of light (external light) incident toward the display apparatus 1.

The cover window CW may be located on the anti-reflection layer 600. The cover window CW may protect elements located under the cover window CW. The cover window CW may be coupled to the upper surface of the anti-reflection layer 600 by using an optically clear adhesive OCA.

Figure 4A:
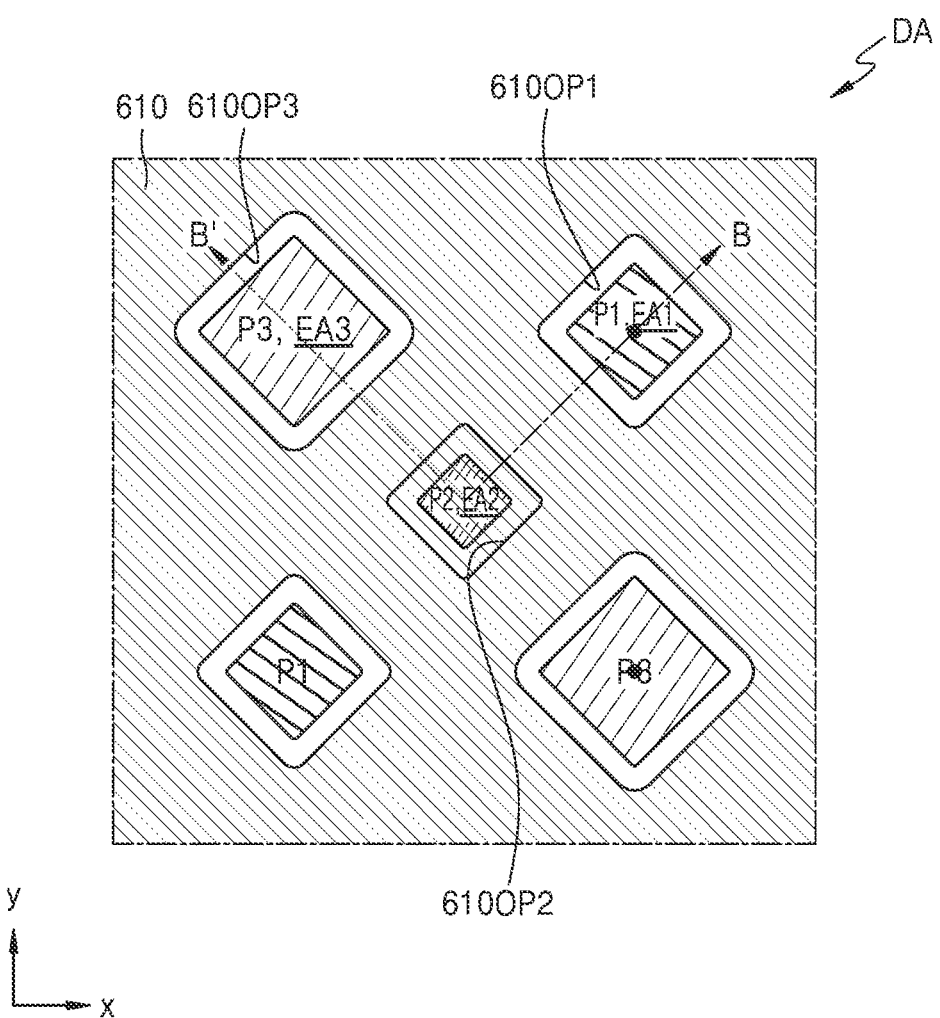
FIGS. 4A and 4B are schematic plan views of a pixel arrangement of a display apparatus according to some embodiments.
Figure 4B:
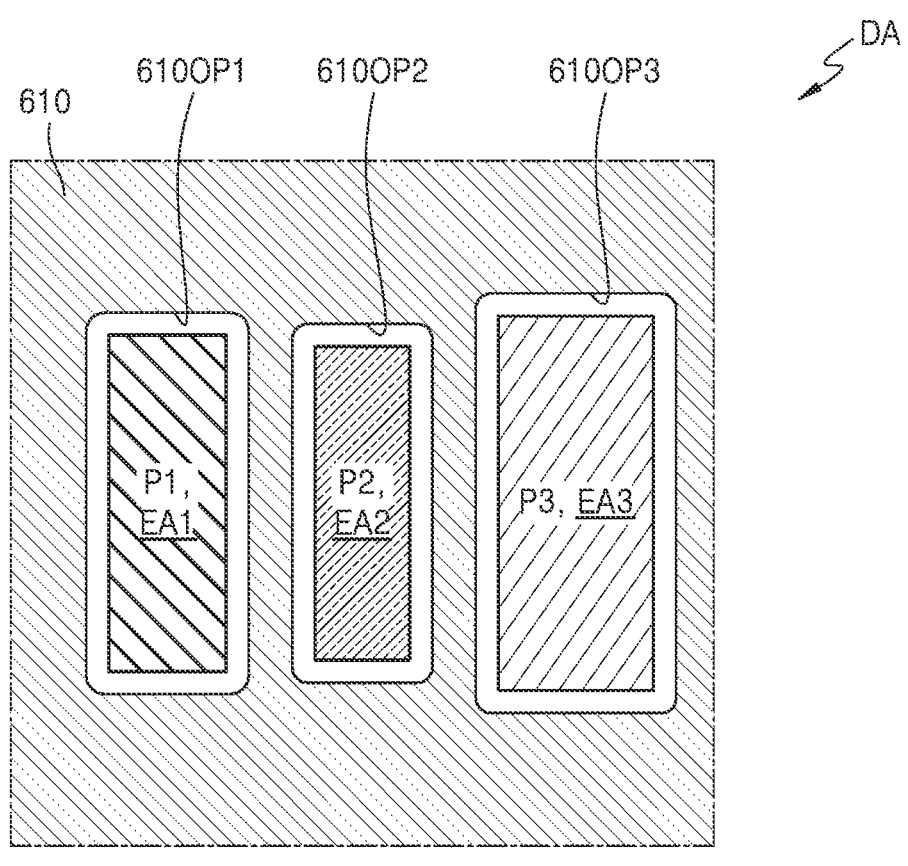

FIGS. 4A and 4B are schematic plan views of a pixel arrangement of the display apparatus 1 according to some embodiments.

Referring to FIG. 4A, the display apparatus 1 may include a plurality of pixels arranged in the display area DA. The plurality of pixels may include a first pixel P1, a second pixel P2, and a third pixel P3 configured to emit different colors of light. As an example, the first pixel P1 may be configured to emit red light, the second pixel P2 may be configured to emit green light, and the third pixel P3 may be configured to emit blue light. However, the embodiments are not limited thereto. As an example, the first pixel P1 may be configured to emit blue light, the second pixel P2 may be configured to emit green light, and the third pixel P3 may be configured to emit red light. However, various modifications may be made.

The first pixel P1, the second pixel P2, and the third pixel P3 may each have a polygonal shape in a plan view. As an example, although it is shown in FIG. 4A that the first pixel P1, the second pixel P2, and the third pixel P3 have a quadrangular shape having round vertexes, the embodiments are not limited thereto. According to some embodiments, the first pixel P1, the second pixel P2, and the third pixel P3 may each have a circular shape or an elliptical shape.

The sizes of the first pixel P1, the second pixel P2, and the third pixel P3 may be different from one another. As an example, the area of the second pixel P2 may be less than the areas of the first pixel P1 and the third pixel P3. The area of the first pixel P1 may be greater than the area of the third pixel P3. According to some embodiments, the sizes of the first pixel P1, the second pixel P2, and the third pixel P3 may be substantially the same. However, various modifications may be made.

Figure 5:
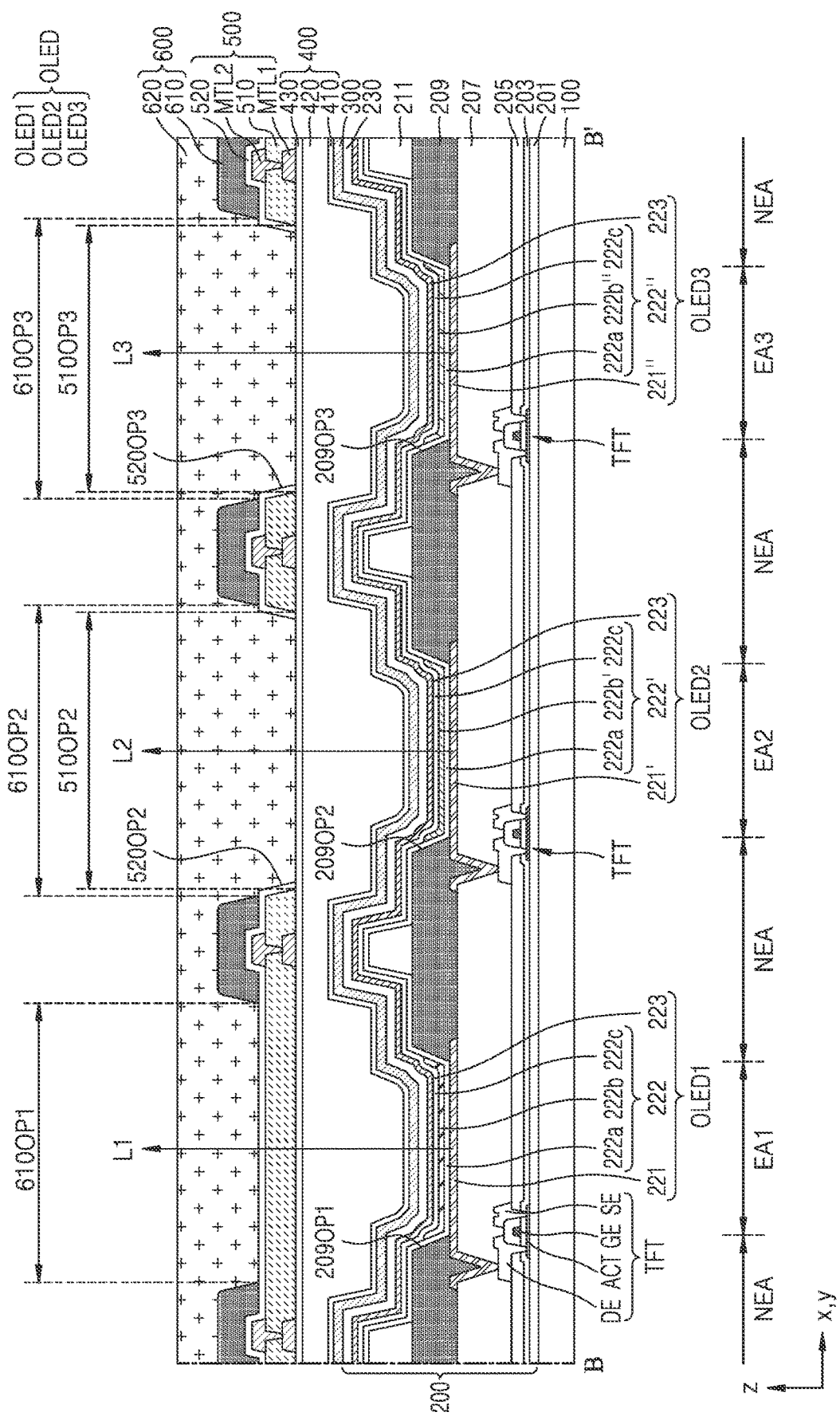
FIG. 5 is a schematic cross-sectional view of a display apparatus according to some embodiments.

In the present specification, the size of the first pixel P1 denotes the size of a first emission area EA1 of a first organic light-emitting diode OLED1 (see FIG. 5), the size of the second pixel P2 denotes the size of a second emission area EA2 of a second organic light-emitting diode OLED2 (see FIG. 5), and the size of the third pixel P3 denotes the size of a third emission area EA3 of a third organic light-emitting diode OLED3 (see FIG. 5). As an example, the first emission area EA1, the second emission area EA2, and the third emission area EA3 may be respectively defined by a first pixel opening 209OP1, a second pixel opening 209OP2, and a third pixel opening 209OP3 of a pixel-defining layer 209 (see FIG. 5).

A light-blocking layer 610 located on a display element layer may include a first opening 610OP1 corresponding to the first pixel P1, a second opening 610OP2 corresponding to the second pixel P2, and a third opening 610OP3 corresponding to the third pixel P3. The first opening 610OP1, the second opening 610OP2, and the third opening 610OP3 are regions formed by removing portions of the light-blocking layer 610. Light emitted by each of the display elements may be emitted to the outside through the first opening 610OP1, the second opening 610OP2, and the third opening 610OP3. A body portion of the light-blocking layer 610 may include a material configured to reflect or cancel external light. Accordingly, the visibility of the display apparatus 1 may be improved.

In a plan view, the first opening 610OP1 of the light-blocking layer 610 may be arranged to surround the first pixel P1, the second opening 610OP2 may be arranged to surround the second pixel P2, and the third opening 610OP3 may be arranged to surround the third pixel P3. According to some embodiments, the first opening 610OP1, the second opening 610OP2, and the third opening 610OP3 of the light-blocking layer 610 may have a quadrangular shape having round edges.

The area of the first opening 610OP1 of the light-blocking layer 610 may be less than the area of the first pixel P1, the area of the second opening 610OP2 may be less than the area of the second pixel P2, and the area of the third opening 610OP3 may be less than the area of the third pixel P3. However, the embodiments according to the present disclosure are not limited thereto. The area of the first opening 610OP1 of the light-blocking layer 610 may be substantially the same as the area of the first pixel P1, the area of the second opening 610OP2 may be substantially the same as the area of the second pixel P2, and the area of the third opening 610OP3 may be substantially the same as the area of the third pixel P3.

As shown in FIG. 4A, the first pixel P1, the second pixel P2, and the third pixel P3 may be arranged in a pixel arrangement of a PENTILE™ structure. However, the embodiments according to the present disclosure are not limited thereto. As an example, as shown in FIG. 4B, sub-pixels may be arranged in a stripe structure. In addition, according to some embodiments, the first pixel P1, the second pixel P2, and the third pixel P3 may be arranged in a mosaic structure and a delta structure. However, various pixel arrangements may be made.

Figure 6:
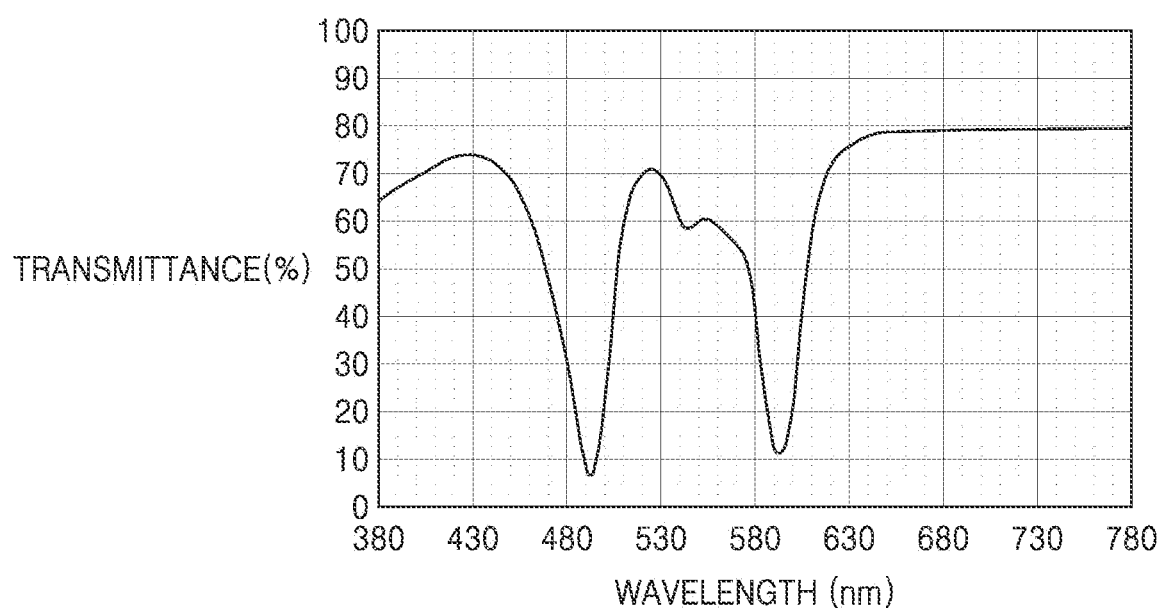
FIG. 6 is a graph showing a light transmittance of a reflection-adjusting layer according to some embodiments.
Figure 7:
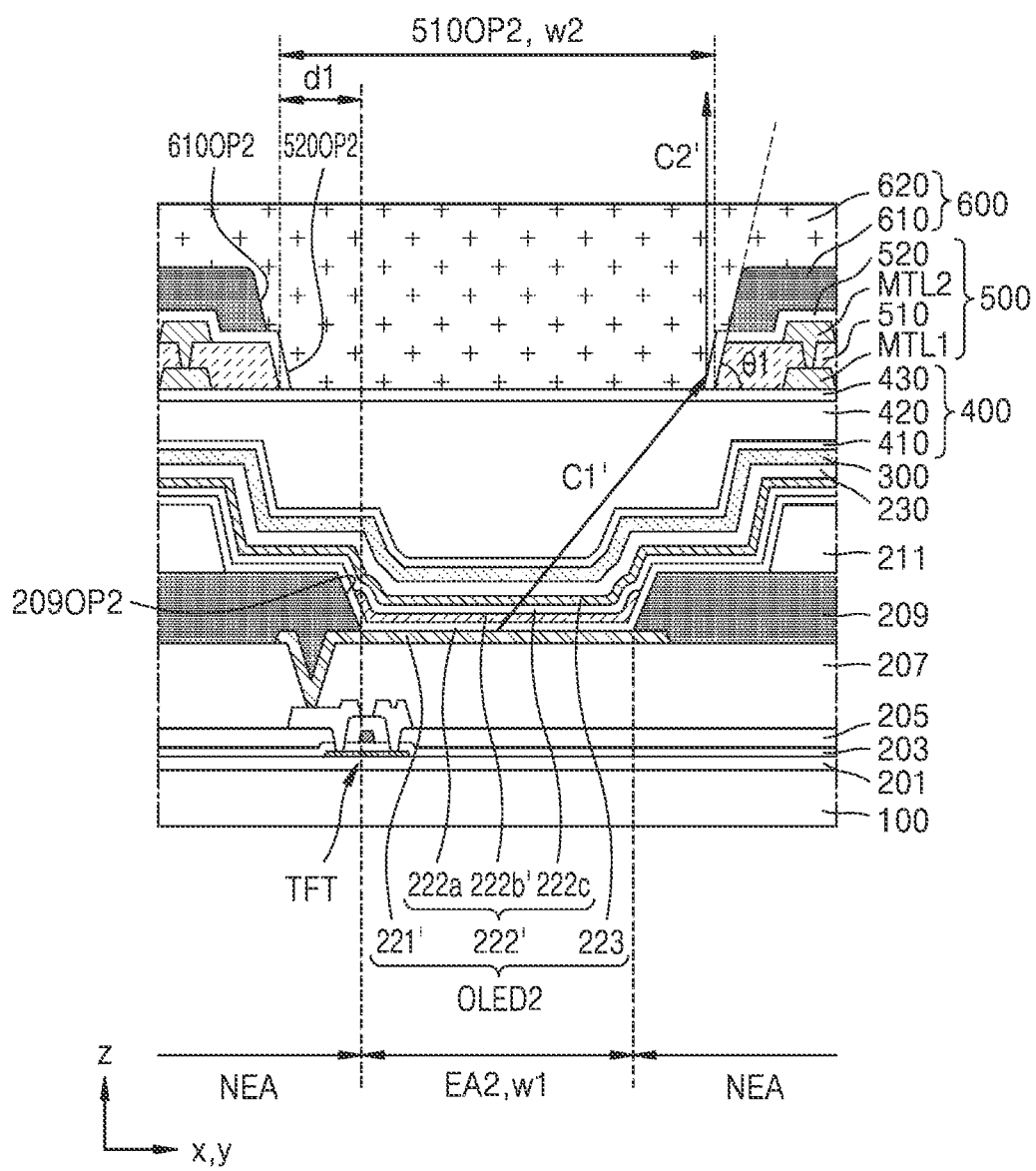
FIGS. 7 and 8 are cross-sectional views of a portion of the display apparatus shown in FIG. 5.
Figure 8:
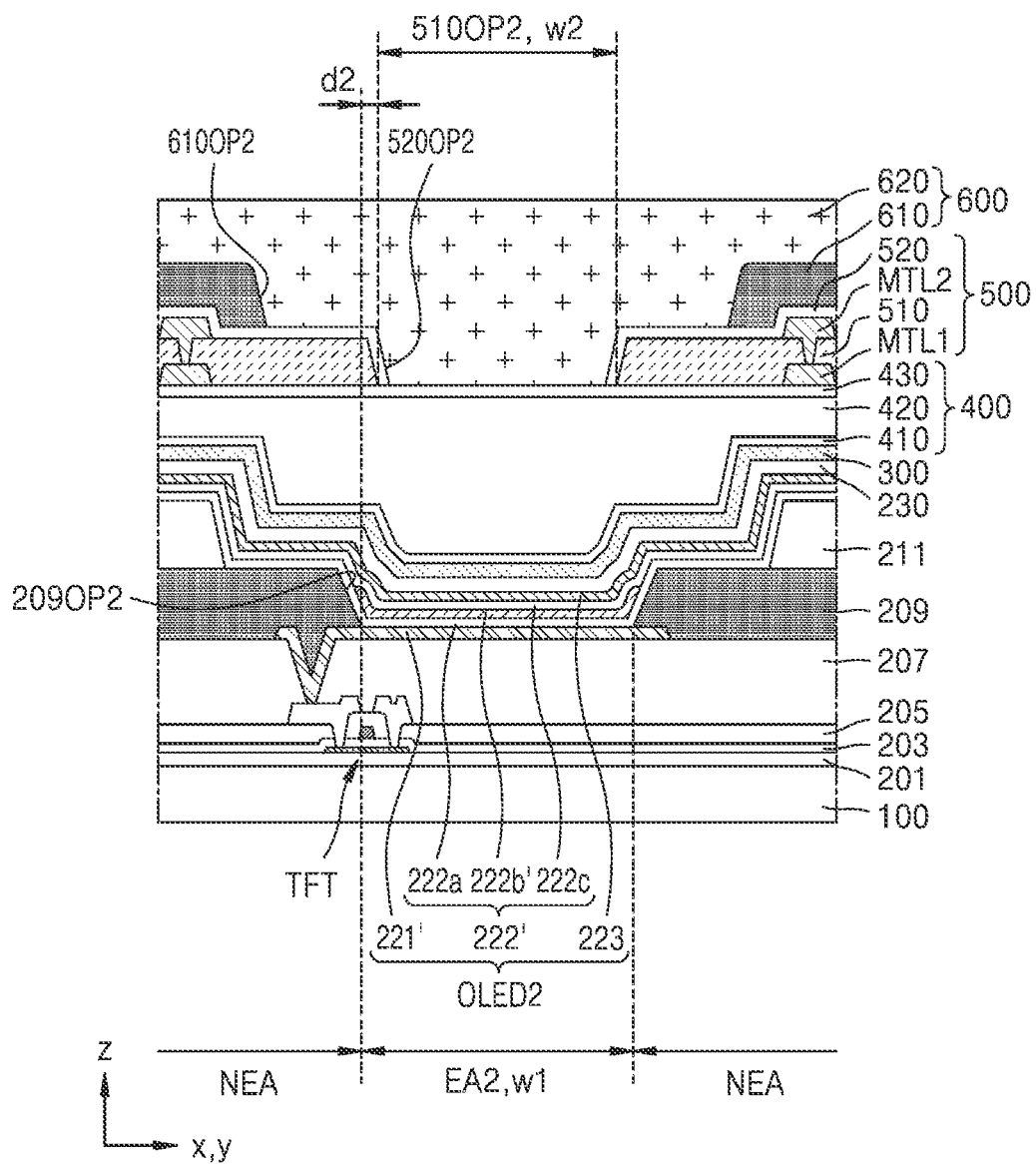

FIG. 5 is a cross-sectional view of the display apparatus 1 according to some embodiments, FIG. 6 is a graph showing a light transmittance of a reflection-adjusting layer according to some embodiments, and FIGS. 7 and 8 are cross-sectional views of a portion of the display apparatus 1 shown in FIG. 5. FIG. 5 is a cross-sectional view of the display apparatus, taken along the line B-B shown in FIG. 4A, and FIGS. 7 and 8 are cross-sectional views of the second organic light-emitting diode OLED2 shown in FIG. 5.

Referring to FIG. 5, the display apparatus 1 according to some embodiments may include the substrate 100, the display layer 200, the low reflection layer 300, the thin-film encapsulation layer 400, the touch sensing layer 500, and the anti-reflection layer 600 as described with reference to FIG. 3.

The display layer 200 may include the organic light-emitting diode OLED, a thin-film transistor TFT, a buffer layer 201, a gate insulating layer 203, an interlayer insulating layer 205, a planarization layer 207, the pixel-defining layer 209, and a spacer 211.

The buffer layer 201 may be located on the substrate 100. The buffer layer 201 may reduce or block the penetration of foreign materials, moisture, and external air from below the substrate 100. In addition, the buffer layer 201 may provide a flat surface on the upper surface of the substrate 100. The buffer layer 201 may include silicon oxide ($SiO_2$) or silicon nitride ($SiN_x$). According to some embodiments, a barrier layer may be further located between the substrate 100 and the buffer layer 201, the barrier layer blocking the penetration of external air. The barrier layer may include an inorganic insulating material.

The thin-film transistors TFT may be located on the buffer layer 201. The thin-film transistor TFT shown in FIG. 5 may correspond to the first thin-film transistor T1 (see FIG. 2) shown in FIG. 2. The thin-film transistor TFT may include a semiconductor layer ACT, a gate electrode GE, a source electrode SE, and a drain electrode DE. The thin-film transistors TFT may be respectively and electrically connected to a first pixel electrode 221 of the first organic light-emitting diode OLED1, a second pixel electrode 221' of the second organic light-emitting diode OLED2, and a third pixel electrode 221" of the third organic light-emitting diode OLED3 to drive their corresponding organic light-emitting diodes.

The semiconductor layer ACT may be located on the buffer layer 201 and may include polycrystalline silicon. Alternatively, the semiconductor layer ACT may include amorphous silicon. Alternatively, the semiconductor layer ACT may include an oxide of at least one of indium (In), gallium (Ga), stannum (Sn), zirconium (Zr), vanadium (V), hafnium (Hf), cadmium (Cd), germanium (Ge), chromium (Cr), titanium (Ti), or zinc (Zn). The semiconductor layer ACT may include a channel region, a source region, and a drain region, the source region and the drain region being doped with impurities.

The gate electrode GE, the source electrode SE, and the drain electrode DE may each include various conductive materials. The gate electrode GE may include at least one of molybdenum, aluminum, copper, or titanium. As an example, the gate electrode GE may include a single molybdenum layer, or have a three-layered structure including a molybdenum layer, an aluminum layer, and a molybdenum layer. The source electrode SE and the drain electrode DE may include at least one of copper, titanium, or aluminum. As an example, the source electrode SE and the drain electrode DE may each include a three-layered structure of a titanium layer, an aluminum layer, and a titanium layer. According to some embodiments, the source electrode SE or the drain electrode DE may be omitted, and a source region or a drain region of the semiconductor layer ACT may serve as the source electrode or the drain electrode.

To secure insulation between the semiconductor layer ACT and the gate electrode GE, the gate insulating layer 203 may be located between the semiconductor layer ACT and the gate electrode GE, wherein the gate insulating layer 203 includes an inorganic material such as silicon oxide, silicon nitride, and/or silicon oxynitride. The interlayer insulating layer 205 may be located on the gate electrode GE, wherein the interlayer insulating layer 205 includes an inorganic material such as silicon oxide, silicon nitride, and/or silicon oxynitride. The source electrode SE and the drain electrode DE may be located on the interlayer insulating layer 205. An insulating layer including an inorganic material may be formed by chemical vapor deposition (CVD) or atomic layer deposition (ALD).

The planarization layer 207 may be located on the thin-film transistor TFT. According to some embodiments, the planarization layer 207 may be formed, and then chemical and/or mechanical polishing may be performed on the upper surface of the planarization layer 207 to provide a flat upper surface. The planarization layer 207 may include a general-purpose polymer such as photosensitive polyimide, polyimide, polycarbonate (PC), benzocyclobutene (BCB), polyimide, hexamethyldisiloxane (HMDSO), polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, or a vinyl alcohol-based polymer. Though it is shown in FIG. 5 that the planarization layer 207 is a single layer, the planarization layer 207 may include a multi-layer structure.

The organic light-emitting diode OLED may be located on the planarization layer 207, wherein the organic light-emitting diode OLED includes the first organic light-emitting diode OLED1, the second organic light-emitting diode OLED2, and the third organic light-emitting diode OLED3.

The first organic light-emitting diode OLED1 may include the first pixel electrode 221, a first intermediate layer 222, and an opposite electrode 223, the second organic light-emitting diode OLED2 may include the second pixel electrode 221', a second intermediate layer 222', and the opposite electrode 223, and the third organic light-emitting diode OLED3 may include the third pixel electrode 221", a third intermediate layer 222", and the opposite electrode 223. Because the first organic light-emitting diode OLED1, the second organic light-emitting diode OLED2, and the third organic light-emitting diode OLED3 have a substantially same or similar construction, the construction of the first organic light-emitting diode OLED1 is mainly described and repeated description is omitted.

The first pixel electrode 221 may be located on the planarization layer 207. The first pixel electrode 221, the second pixel electrode 221', and the third pixel electrode 221" may be apart from each other to correspond to the pixels, respectively.

The first pixel electrode 221 may be a reflective electrode. As an example, the first pixel electrode 221 may include a reflective layer and a transparent or semi-transparent conductive layer, the reflective layer including silver (Ag), magnesium (Mg), aluminum (Al), platinum (Pt), palladium (Pd), gold (Au), nickel (Ni), neodymium (Nd), iridium (Ir), chrome (Cr), or a compound thereof. The transparent or semi-transparent conductive layer may include at least one of indium tin oxide (ITO), indium zinc oxide (IZO), zinc oxide (ZnO), indium oxide ($In_2O_3$), indium gallium oxide (IGO), or aluminum zinc oxide (AZO). As an example, the first pixel electrode 221 may have a stack structure of ITO/Ag/ITO.

The pixel-defining layer 209 may be located on the first pixel electrode 221, the second pixel electrode 221', and the third pixel electrode 221". The pixel-defining layer 209 may include the first pixel opening 209OP1, the second pixel opening 209OP2, and the third pixel opening 209OP3 respectively exposing the central portions of the first pixel electrode 221, the second pixel electrode 221', and the third pixel electrode 221". The pixel-defining layer 209 may prevent arcs and the like from occurring by covering the edges of the first pixel electrode 221, the second pixel electrode 221', and the third pixel electrode 221" and increasing distances between the edges of the first pixel electrode 221, the second pixel electrode 221', and the third pixel electrode 221" and the opposite electrode 223. The first emission area EA1 may be defined by the first pixel opening 209OP1, the second emission area EA2 may be defined by the second pixel opening 209OP2, and the third emission area EA3 may be defined by the third pixel opening 209OP3.

The pixel-defining layer 209 may include an organic insulating material. Alternatively, the pixel-defining layer 209 may include an inorganic insulating material such as silicon nitride, silicon oxynitride, or silicon oxide. Alternatively, the pixel-defining layer 209 may include an organic insulating material and an inorganic insulating material.

According to some embodiments, the pixel-defining layer 209 may include a light-blocking material and be provided in black. The light-blocking material may include carbon black, carbon nanotubes, a resin or paste including black dye, metal particles, for example, nickel, aluminum, molybdenum, and an alloy thereof, metal oxide particles (e.g., chrome oxide) or metal nitride particles (e.g., chrome nitride). In the case where the pixel-defining layer 209 includes a light-blocking material, external light reflection by metal structures located below the pixel-defining layer 209 may be reduced. However, the embodiments according to the present disclosure are not limited thereto. According to some embodiments, the pixel-defining layer 209 may not include the light-blocking material but may include a light-transmissive organic insulating material.

The spacer 211 may be located on the pixel-defining layer 209. The spacer 211 may include an organic insulating material such as polyimide. Alternatively, the spacer 211 may include an inorganic insulating material such as silicon nitride ($SiN_x$) or silicon oxide ($SiO_2$), or include an organic insulating material and an inorganic insulating material.

According to some embodiments, the spacer 211 may include the same material as a material of the pixel-defining layer 209. In this case, the pixel-defining layer 209 and the spacer 211 may be formed together during a mask process that uses a half-tone mask and the like. According to some embodiments, the spacer 211 may include a different material from a material of the pixel-defining layer 209.

The first intermediate layer 222 may be located on the first pixel electrode 221, the first intermediate layer 222' may be located on the second pixel electrode 221', and the third intermediate layer 222" may be located on the third pixel electrode 221". The first intermediate layer 222 may include a first emission layer 222b configured to emit first light L1, the second intermediate layer 222' may include a second emission layer 222b' configured to emit second light L2, and the third intermediate layer 222" may include a third emission layer 222b" configured to emit third light L3.

The first emission layer 222b may be located inside the first pixel opening 209OP1 of the pixel-defining layer 209 to correspond to the first pixel electrode 221. The first emission layer 222b may include an organic material including a fluorescent or phosphorous material that may emit red light. The organic material may include a low molecular weight organic material or a polymer organic material. Alternatively, the first emission layer 222b may include an inorganic material including quantum dots and the like. Specifically, a quantum dot denotes a crystal of a semiconductor compound and may include an arbitrary material that may emit light in various light emission wavelengths depending on the size of the crystal. The quantum dot may include, for example, one of a Group III-V semiconductor compound, a Group II-VI semiconductor compound, a Group III-V semiconductor compound, a Group I-III-VI semiconductor compound, a Group IV-VI semiconductor compound, a Group IV element, a compound, and an arbitrary combination thereof.

Likewise, the second emission layer 222b' may be located inside the second pixel opening 209OP2 of the pixel-defining layer 209, and the third emission layer 222b" may be located inside the third pixel opening 209OP3 of the pixel-defining layer 209. The second emission layer 222b' may include an organic material including a fluorescent or phosphorous material that may emit green light. The third emission layer 222b" may include an organic material including a fluorescent or phosphorous material that may emit blue light.

A first common layer 222a and a second common layer 222c may be located under and on the first emission layer 222b, the second emission layer 222b', and the third emission layer 222b". The first common layer 222a may include, for example, a hole transport layer (HTL), or include an HTL and a hole injection layer (HIL). The second common layer 222c may include, for example, an electron transport layer (ETL), or include an ETL and an electron injection layer (EIL). According to some embodiments, the second common layer 222c may be omitted.

The first emission layer 222b, the second emission layer 222b', and the third emission layer 222b" are patterned to respectively correspond to the first pixel opening 209OP1, the second pixel opening 209OP2, and the third pixel opening 209OP3, while the first common layer 222a and the second common layer 222c may each be formed as one body to cover the substrate 100 entirely. In other words, the first common layer 222a and the second common layer 222c may each be formed as one body to entirely cover the first pixel electrode 221, the second pixel electrode 221', and the third pixel electrode 221" arranged in the display area DA (see FIG. 1).

The opposite electrode 223 may be located on the first intermediate layer 222. The opposite electrode 223 may include a conductive material having a low work function. As an example, the opposite electrode 223 may include a (semi) transparent layer including silver (Ag), magnesium (Mg), aluminum (Al), platinum (Pt), palladium (Pd), gold (Au), nickel (Ni), neodymium (Nd), iridium (Ir), chrome (Cr), lithium (Li), calcium (Ca), ytterbium (Yb), or an alloy thereof. As an example, the opposite electrode 223 may include AgMg or AgYb. Alternatively, the opposite electrode 223 may further include a layer on the (semi) transparent layer, the layer including ITO, IZO, ZnO, or $In_2O_3$.

Layers from the first pixel electrode 221 to the opposite electrode 223 may constitute the first organic light-emitting diode OLED1, layers from the second pixel electrode 221' to the opposite electrode 223 may constitute the second organic light-emitting diode OLED2, and layers from the third pixel electrode 221" to the opposite electrode 223 may constitute the third organic light-emitting diode OLED3.

According to some embodiments, the display apparatus 1 may further include a capping layer 230 located on the first organic light-emitting diode OLED1, the second organic light-emitting diode OLED2, and the third organic light-emitting diode OLED3. The capping layer 230 may be integrally formed to cover the substrate 100 entirely. The capping layer 230 may be configured to improve a light-emitting efficiency of the organic light-emitting diode OLED based on a constructive interference principle. The capping layer 230 may include a material having a refractive index of 1.6 or more with respect to light having a wavelength of, for example, about 589 nm.

The capping layer 230 may be an organic capping layer including an organic material, an inorganic capping layer including an inorganic material, or a composite capping layer including an organic material and an inorganic material. As an example, the capping layer 230 is a carbocyclic compound, a heterocyclic compound, an amine group-containing compound, porphine derivatives, phthalocyanine derivatives, naphthalocyanine derivatives, alkali metal complexes, alkali earth metal complexes, or an arbitrary combination thereof. Carbocyclic compounds, heterocyclic compounds, and amine group-containing compounds may optionally be substituted with substituents including O, N, S, Se, Si, F, Cl, Br, I, or an arbitrary combination thereof.

The low reflection layer 300 may be arranged on the capping layer 230. The low reflection layer 300 may be located on the first organic light-emitting diode OLED1, the second organic light-emitting diode OLED2, and the third organic light-emitting diode OLED3. The low reflection layer 300 may include an inorganic material having low reflectivity. According to some embodiments, the low reflection layer 300 may include metal or metal oxide. In the case where the low reflection layer 300 includes metal, the metal may include, for example, one of ytterbium (Yb), bismuth (Bi), cobalt (Co), molybdenum (Mo), titanium (Ti), zirconium (Zr), aluminum (Al), chrome (Cr), niobium (Nb), platinum (Pt), tungsten (W), indium (In), tin (Sn), iron (Fe), nickel (Ni), tantalum (Ta), manganese (Mn), zinc (Zn), germanium (Ge), silver (Ag), magnesium (Mg), gold (Au), copper (Cu), calcium (Ca), and a combination thereof. In addition, in the case where the low reflection layer 300 includes metal oxide, the metal oxide may include, for example, one of $SiO_2$, $TiO_2$, $ZrO_2$, $Ta_2O_5$, $HfO_2$, $Al_2O_3$, ZnO, $Y_2O_3$, BeO, MgO, $PbO_2$, $WO_3$, $SiN_x$, LiF, $CaF_2$, $MgF_2$, CdS, and a combination thereof.

According to some embodiments, an absorption coefficient k of an inorganic material of the low reflection layer 300 may be 4.0 or less and greater than 0.5 ($0.5<k\leq4.0$). In addition, an inorganic material of the low reflection layer 300 may have a refractive index n of 1 or more ($n\geq1.0$).

The low reflection layer 300 may reduce external light reflectivity by inducing light incident to the inside of the display apparatus 1 to destructively interfere with light reflected by a metal located below the low reflection layer 300. Accordingly, because external light reflectivity is reduced by the low reflection layer 300, the display quality and visibility of the display apparatus 1 may be improved.

Though FIG. 5 shows a structure in which the low reflection layer 300 is located on the entire surface of the substrate 100 as the opposite electrode 223 and the capping layer 230, the embodiments according to the present disclosure are not limited thereto. As an example, the low reflection layer 300 may be patterned for each pixel.

The thin-film encapsulation layer 400 may be located on the low reflection layer 300. The thin-film encapsulation layer 400 may include at least one inorganic encapsulation layer and at least one organic encapsulation layer. As an example, the thin-film encapsulation layer 400 may include a first inorganic encapsulation layer 410, an organic encapsulation layer 420, and a second inorganic encapsulation layer 430 that are sequentially stacked.

The first inorganic encapsulation layer 410 and the second inorganic encapsulation layer 430 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide (ZnO). The first inorganic encapsulation layer 410 and the second inorganic encapsulation layer 430 may each have a single-layered structure or a multi-layered structure including the inorganic insulating material.

The organic encapsulation layer 420 may alleviate internal stress of the first inorganic encapsulation layer 410 and/or the second inorganic encapsulation layer 430. The organic encapsulation layer 420 may include a polymer-based material. As an example, the polymer-based material may include polyethylene terephthalate, polyethylene naphthalate, polycarbonate, polyimide, polyethylene sulfonate, polyoxymethylene, polyarylate, hexamethyldisiloxane, an acryl-based resin (e.g., polymethylmethacrylate, poly acrylic acid, and the like), or an arbitrary combination thereof.

The organic encapsulation layer 420 may be formed by coating a material having fluidity and containing monomers and then allowing the monomers to combine with each other and react to form a polymer using heat or light such as an ultraviolet ray. Alternatively, the organic encapsulation layer 420 may be formed by coating a polymer material.

Even when cracks occur inside the thin-film encapsulation layer 400, the thin-film encapsulation layer 400 may prevent the cracks from being connected between the first inorganic encapsulation layer 410 and the organic encapsulation layer 420 or between the organic encapsulation layer 420 and the second inorganic encapsulation layer 430 through the above multi-layered structure. With this configuration, forming of a path through which external moisture or oxygen penetrates the display area DA may be prevented or reduced. In addition, a reflection color of a display apparatus may be adjusted by adjusting the thickness of each layer of the thin-film encapsulation layer 400 and changing reflectance of external light according to a wavelength band of external light. In addition, the thin-film encapsulation layer 400 may provide a flat base surface to the touch sensing layer 500 located on the thin-film encapsulation layer 400.

The touch sensing layer 500 may be located on the thin-film encapsulation layer 400. The touch sensing layer 500 may include a first touch electrode layer MTL1, a first touch insulating layer 510, a second touch electrode layer MTL2, and a second touch insulating layer 520. The first touch electrode layer MTL1 may be directly located on the thin-film encapsulation layer 400. In this case, the first touch electrode layer MTL1 may be directly located on the second inorganic encapsulation layer 430 of the thin-film encapsulation layer 400. However, the embodiments according to the present disclosure are not limited thereto.

As an example, the touch sensing layer 500 may include an insulating layer between the first touch electrode layer MTL1 and the thin-film encapsulation layer 400. The insulating layer may be located on the second inorganic encapsulation layer 430 of the thin-film encapsulation layer 400 to provide a flat base surface to the first touch electrode layer MTL1 and the like. In this case, the first touch electrode layer MTL1 may be directly located on the insulating layer. The insulating layer may include an inorganic insulating material such as silicon oxide ($SiO_2$), silicon nitride ($SiN_x$), and silicon oxynitride (SiON). Alternatively, the insulating layer may include an organic insulating material.

According to some embodiments, the second touch electrode layer MTL2 may be located on the first touch electrode layer MTL1. The second touch electrode layer MTL2 may serve as a touch electrode configured to sense a user's touch input. The first touch electrode MTL1 may serve as a connection electrode connecting, in one direction, the second touch electrode MTL2 that is patterned. According to some embodiments, both the first touch electrode layer MTL1 and the second touch electrode layer MTL2 may serve as sensors. The first touch electrode layer MTL1 may be electrically connected to the second touch electrode layer MTL2 through a contact hole passing through the first touch insulating layer 510.

According to some embodiments, the first touch electrode layer MTL1 and the second touch electrode layer MTL2 may each have, for example, a mesh structure such that light emitted from the first organic light-emitting diodes OLED1, the second organic light-emitting diodes OLED2, and the third organic light-emitting diodes OLED3 passes therethrough. In this case, the first touch electrode layer MTL1 and the second touch electrode layer MTL2 may each be arranged in a non-emission area NEA not to overlap the first emission area EA1, the second emission area EA2, and the third emission area EA3.

The first touch electrode layer MTL1 and the second touch electrode layer MTL2 may each include a metal layer or a transparent conductive layer. The metal layer may include at least one of molybdenum (Mo), silver (Ag), titanium (Ti), copper (Cu), aluminum (Al), or an alloy thereof. The transparent conductive layer may include a transparent conductive oxide such as indium tin oxide (ITO), indium zinc oxide (IZO), zinc oxide (ZnO), and indium tin zinc oxide (ITZO). In addition, the transparent conductive layer may include a conductive polymer such as poly-3,4-ethylene dioxy thiophene (PEDOT), metal nanowires, carbon nanotubes, or graphene.

The first touch insulating layer 510 may be located between the first touch electrode layer MTL1 and the second touch electrode layer MTL2. The first touch insulating layer 510 may include an organic material layer including dye, pigment, or a combination thereof configured to absorb some wavelength bands of visible light. As an example, the first touch insulating layer 510 may be formed by coating polymer in which dye, pigment, and a combination thereof having a red component are uniformly dispersed. The first touch insulating layer 510 may transmit first light L1 of a red color emitted from the first organic light-emitting diode OLED1 and absorb light in wavelengths except for red light, thereby implementing red light of high color purity.

The first touch insulating layer 510 may include C.I pigment red 177, C.I pigment red 254, C.I pigment yellow 150, C.I pigment yellow 138, or a combination thereof. However, the embodiments according to the present disclosure are not limited thereto.

As an example, the first touch insulating layer 510 may include a compound represented by one of Chemical Formulas 1 to 4 below. Chemical Formulas 1 to 4 may each have a structure of C.I pigment red 177, C.I pigment red 254, C.I pigment yellow 150, or C.I pigment yellow 138. Chemical Formulas 1 to 4 are provided as examples and the embodiments according to the present disclosure are not limited thereto.

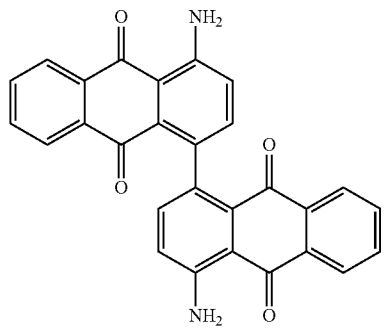

Chemical Formula 1

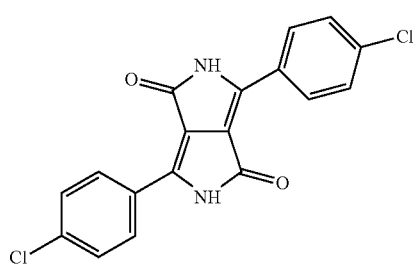

Chemical Formula 2

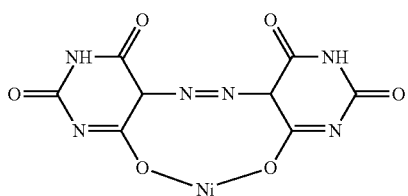

Chemical Formula 3

Chemical Formula 4

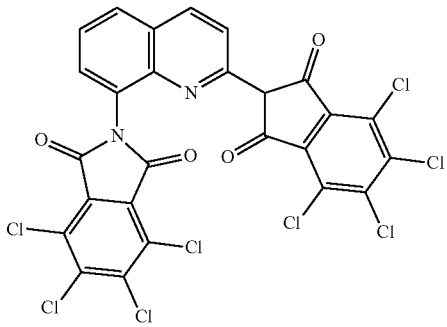

The first touch insulating layer 510 is a base polymer and may include polyethylene terephthalate, polyethylene naphthalate, polycarbonate, polyimide, polyethylene sulfonate, polyoxymethylene, polyarylate, hexamethyldisiloxane, an acryl-based resin (e.g., polymethylmethacrylate, poly acrylic acid, etc.), or an arbitrary combination thereof.

The first touch insulating layer 510 may overlap the first emission area EA1 of the first organic light-emitting diode OLED1 and may not overlap the second emission area EA2 of the second organic light-emitting diode OLED2 and the third emission area EA3 of the third organic light-emitting diode OLED3. In other words, the first touch insulating layer 510 may include a fourth opening 510OP2 and a fifth opening 510OP3, wherein the fourth opening 510OP2 overlaps the second pixel opening 209OP2 of the pixel-defining layer 209, and the fifth opening 510OP3 overlaps the third pixel opening 209OP3. Accordingly, second light L2 of a red color emitted from the second organic light-emitting diode OLED2, and third light L3 of a blue color emitted from the third organic light-emitting diode OLED3 may not pass through the first touch insulating layer 510 but may be emitted as they are.

According to some embodiments, as shown in FIG. 7, a second width w2 of the fourth opening 510OP2 of the first touch insulating layer 510 may be greater than a first width w1 of the second emission area EA2 of the second organic light-emitting diode OLED2. In this case, a distance d1 from a boundary of the second pixel opening 209OP2 of the pixel-defining layer 209 to a boundary of the fourth opening 510OP2 of the first touch insulating layer 510 may be 2 μm or less.

According to some embodiments, the lateral wall of the first touch insulating layer 510 defining the fourth opening 510OP2 may have a tapered angle of a first angle θ1 with respect to the upper surface of the substrate 100. According to some embodiments, the first angle θ1 may be about 70° to about 88°. The first angle θ1 may be about 70° to about 85°.

According to some embodiments, as shown in FIG. 8, the second width w2 of the fourth opening 510OP2 of the first touch insulating layer 510 may be less than or substantially the same as the first width w1 of the second emission area EA2 of the second organic light-emitting diode OLED2. In this case, a distance d2 from a boundary of the second pixel opening 209OP2 of the pixel-defining layer 209 to a boundary of the fourth opening 510OP2 of the first touch insulating layer 510 may be 1 μm or less.

Though FIGS. 7 and 8 mainly describe the second organic light-emitting diode OLED2, the third organic light-emitting diode OLED3 and the touch sensing layer 500 and the anti-reflection layer 600 on the third organic light-emitting diode OLED3 may have a structure which is the same as or similar to a structure described with reference to FIGS. 7 and 8.

The second touch insulating layer 520 may be arranged on the second touch electrode layer MTL2. According to some embodiments, the second touch insulating layer 520 may include an inorganic insulating material of a low refractive index or an organic insulating material of a low refractive index. As an example, the refractive index of the second touch insulating layer 520 may be about 1.5 or 1.5 or less. According to some embodiments, the second touch insulating layer 520 may include silicon oxide.

The second touch insulating layer 520 may overlap the first emission area EA1 of the first organic light-emitting diode OLED1 and may not overlap the second emission area EA2 of the second organic light-emitting diode OLED2 and the third emission area EA3 of the third organic light-emitting diode OLED3. In other words, the second touch insulating layer 520 may include a sixth opening 520OP2 and a seventh opening 520OP3, wherein the sixth opening 520OP2 overlaps the second pixel opening 209OP2 of the pixel-defining layer 209, and the seventh opening 520OP3 overlaps the third pixel opening 209OP3 of the pixel-defining layer 209. Accordingly, second light L2 of a red color emitted from the second organic light-emitting diode OLED2, and third light L3 of a blue color emitted from the third organic light-emitting diode OLED3 may not pass through the second touch insulating layer 520 but may be emitted as they are.

The anti-reflection layer 600 may be located on the touch sensing layer 500. The anti-reflection layer 600 may include the light-blocking layer 610 and a reflection-adjusting layer 620.

The light-blocking layer 610 may include the first opening 610OP1 overlapping the first emission area EA1 of the first organic light-emitting diode OLED1, the second opening 610OP2 overlapping the second emission area EA2 of the second organic light-emitting diode OLED2, and the third opening 610OP3 overlapping the third emission area EA3 of the third organic light-emitting diode OLED3.

The width (or the area) of the first opening 610OP1 of the light-blocking layer 610 may be greater than or equal to the width (or the area) of the first pixel opening 209OP1, the width (or the area) of the second opening 610OP2 may be greater than or equal to the width (or the area) of the second pixel opening 209OP2, and the width (or the area) of the third opening 610OP3 may be greater than or equal to the width (or the area) of the third pixel opening 209OP3. Accordingly, a body portion of the light-blocking layer 610 may overlap a body portion of the pixel-defining layer 209. In other words, the body portion of the light-blocking layer 610 may be located in only the non-emission area NEA. The body portion of the light-blocking layer 610 is a portion outside the first opening 610OP1, the second opening 610OP2, and the third opening 610OP3, and denotes a portion having a preset volume (a thickness). Likewise, the body portion of the pixel-defining layer 209 is a portion outside the first pixel opening 209OP1, the second pixel opening 209OP2, and the third pixel opening 209OP3, and denotes a portion having a preset volume (a thickness).

According to some embodiments, the width (or the area) of the second opening 610OP2 of the light-blocking layer 610 may be greater than or equal to the width (the area) of the fourth opening 510OP2 of the first touch insulating layer 510, and the width (or the area) of the third opening 610OP3 of the light-blocking layer 610 may be greater than or equal to the width (the area) of the fifth opening 510OP3 of the first touch insulating layer 510.

The light-blocking layer 610 may include an organic insulating material. According to some embodiments, the light-blocking layer 610 may include a light-blocking material and be provided in black. The light-blocking material may include carbon black, carbon nanotubes, a resin or paste including black dye, metal particles, for example, nickel, aluminum, molybdenum, and an alloy thereof, metal oxide particles (e.g., chrome oxide), or metal nitride particles (e.g., chrome nitride).

The reflection-adjusting layer 620 may be located on the light-blocking layer 610. The reflection-adjusting layer 620 may selectively absorb light in some wavelength bands among light reflected from the display apparatus or light incident from the outside of the display apparatus.

It is shown in FIG. 6 that the reflection-adjusting layer 620 absorbs a first wavelength band of about 480 nm to about 500 nm and a second wavelength band of about 585 nm to about 605 nm. In this case, a light transmission spectrum of the reflection-adjusting layer 620 may have a light transmittance of 40% or less in the first wavelength band and the second wavelength band. That is, the reflection-adjusting layer 620 may absorb light of a wavelength deviating from an emission wavelength range of red, green, or blue of the first organic light-emitting diode OLED1, the second organic light-emitting diode OLED2, and the third organic light-emitting diode OLED3. Because the reflection-adjusting layer 620 absorbs light of the wavelength deviating from the emission wavelength range of red, green, or blue of the first organic light-emitting diode OLED1, the second organic light-emitting diode OLED2, and the third organic light-emitting diode OLED3, reduction in the brightness of the display apparatus may be prevented or lessened, and simultaneously, reduction in a light-emission efficiency of the display apparatus may be prevented or reduced, and visibility may be improved.

According to some embodiments, the reflection-adjusting layer 620 may include an organic material layer including dye, pigment, or a combination thereof. The reflection-adjusting layer 620 may include a tetra aza porphyrin (TAP)-based compound, a porphyrin-based compound, a metal porphyrin-based compound, an oxazine-based compound, a squarylium-based compound, a triarylmethane-based compound, a polymethine-based compound, a traquinone-based compound, a phthalocyanine-based compound, an azo-based compound, a perylene-based compound, an xanthene-based compound, a diimmonium-based compound, a dipyrromethene-based compound, a cyanine-based compound, and a combination thereof.

As an example, the reflection-adjusting layer 620 may include a compound represented by one of Chemical Formulas 5 to 8 below. Chemical Formulas 5 to 8 may be chromophore structures corresponding to some of the compounds described above. Chemical Formulas 5 to 8 are provided as examples and the embodiments according to the present disclosure are not limited thereto.

Chemical Formula 5

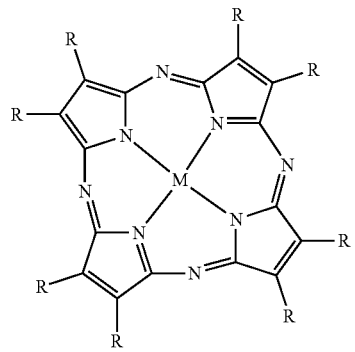

Chemical Formula 6

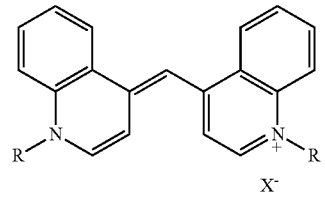

Chemical Formula 7

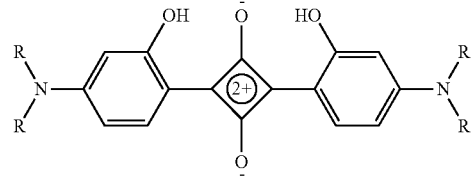

Chemical Formula 8

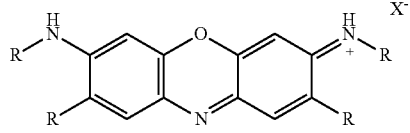

In Chemical Formulas 1 to 4,

M is metal,

X— is a monovalent anion,

Rs are the same or different from each other, and each represents hydrogen, heavy hydrogen (-D), —F, —Cl, —Br, —I, a hydroxyl group, a cyano group, or a nitro group; heavy hydrogen, —F, —Cl, —Br, —I, hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_1$-$C_{60}$ alkyl group, a $C_2$-$C_{60}$ alkenyl group, a $C_2$-$C_{60}$ alkynyl group, or a $C_1$-$C_{60}$ alkoxy group substituted or unsubstituted with —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or any combination thereof;

heavy hydrogen, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_3$-$C_{60}$ carbocyclic group substituted or unsubstituted with —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or any combination thereof, a $C_1$-$C_{60}$ heterocyclic group, a $C_6$-$C_{60}$ aryloxy group, or a $C_6$-$C_{60}$ arylthio group; or —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$)), or —P(=O)($Q_{31}$)($Q_{32}$).

$Q_1$ to $Q_3$, $Q_{11}$ to $Q_{13}$, $Q_{21}$ to $Q_{23}$, and $Q_{31}$ to $Q_{33}$ may each independently be hydrogen; heavy hydrogen; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group substituted or unsubstituted with heavy hydrogen, —F, a cyano group, a $C_1$-$C_{60}$ alkyl group, a $C_1$-$C_{60}$ alkoxy group, a phenyl group, a biphenyl group, or any combination thereof.

According to some embodiments, X may be a halide ion, a carbonylate ion, a nitrate ion, a sulfonate ion, or a bisulfate ion.

As an example, X may be F$^-$, Cl$^-$, Br$^-$, I$^-$, CH$_3$COO$^-$, NO$_3^-$, HSO$_4^-$, a propionate ion, a benzene sulfonate ion, or the like.

According to some embodiments, the reflection-adjusting layer 620 may have a higher refractive index than a refractive index of the second touch insulating layer 520. As an example, a difference in the refractive index between the second touch insulating layer 520 and the reflection-adjusting layer 620 may be 0.1 or more. According to some embodiments, a refractive index n of the reflection-adjusting layer 620 may be 1.6 or more. Accordingly, as shown in FIG. 7, second light L2 progressing along a first path C1 inclined from a direction (a z direction) perpendicular to the substrate 100 may be refracted at the interface between the reflection-adjusting layer 620 and the second touch insulating layer 520 and may progress in a second path C2 in a direction (the z direction) perpendicular to the substrate 100. Accordingly, lateral brightness of the second light L2 may be adjusted. Likewise, lateral brightness of third light L3 may be also adjusted by a difference in the refractive index between the reflection-adjusting layer 620 and the second touch insulating layer 520. A color sense of the display apparatus according to a slope may be adjusted by adjusting the lateral brightness of the second light L2 and the third light L3.

The reflection-adjusting layer 620 may include scattering particles configured to improve a refractive index. The scattering particles may include metal oxide particles or organic particles. Examples of metal oxides for scattering particles include titanium oxide (TiO$_2$), zirconium oxide (ZrO$_2$), aluminum oxide (Al$_2$O$_3$), indium oxide (In$_2$O$_3$), zinc oxide (ZnO), or tin oxide (SnO$_2$), and organic materials for scatterers. Examples of an organic material for the scattering particles include an acrylic resin or a urethane resin.

According to some embodiments, reflectivity of the reflection-adjusting layer 620 measured in a specular component included (SCI) mode may be 10% or less. That is, because the reflection-adjusting layer 620 absorbs external light reflection of the display apparatus, visibility may be improved.

The display apparatus according to some embodiments may utilize the low reflection layer 300 and the reflection-adjusting layer 620 without using a polarizing film to reduce external light reflection.

As a comparative example, in the case where the polarizing film is used to reduce external light reflection, a transmittance of light emitted from the organic light-emitting diode may be remarkably reduced by the polarizing film. In the case where a red color filter, a green color filter, and a blue color filter respectively corresponding to the colors of the pixels are used to reduce external light reflection, a reflected color band may occur according to different light reflectivity for each pixel, and a process operations increase and thus process costs may increase.

Because the display apparatus according to some embodiments includes the low reflection layer 300 and the reflection-adjusting layer 620 applied to the respective pixels in common, a light transmittance may be increased and simultaneously external light reflection may be reduced.

Figure 9:
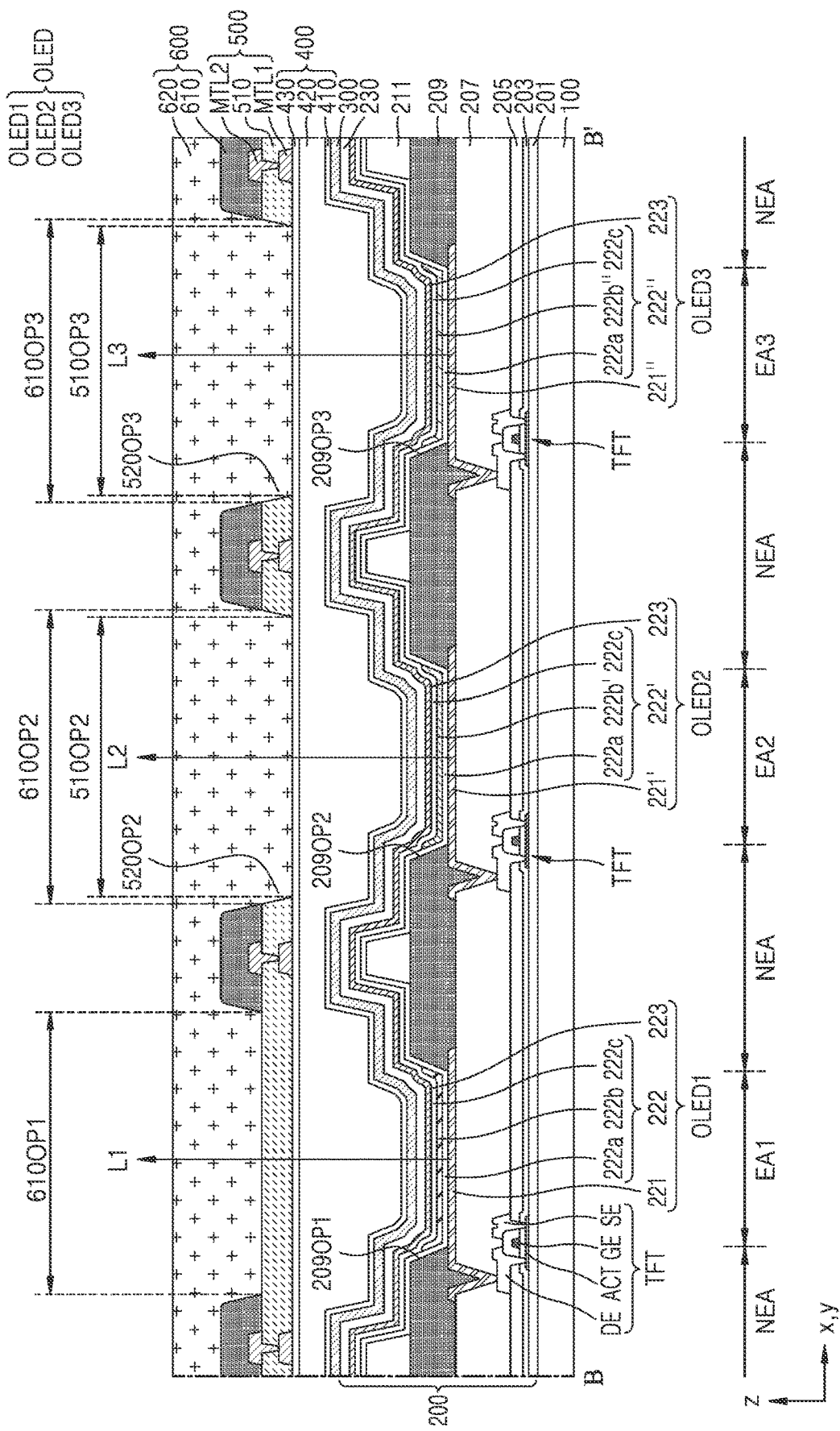
FIG. 9 is a schematic cross-sectional view of a display apparatus according to some embodiments.
Figure 10:
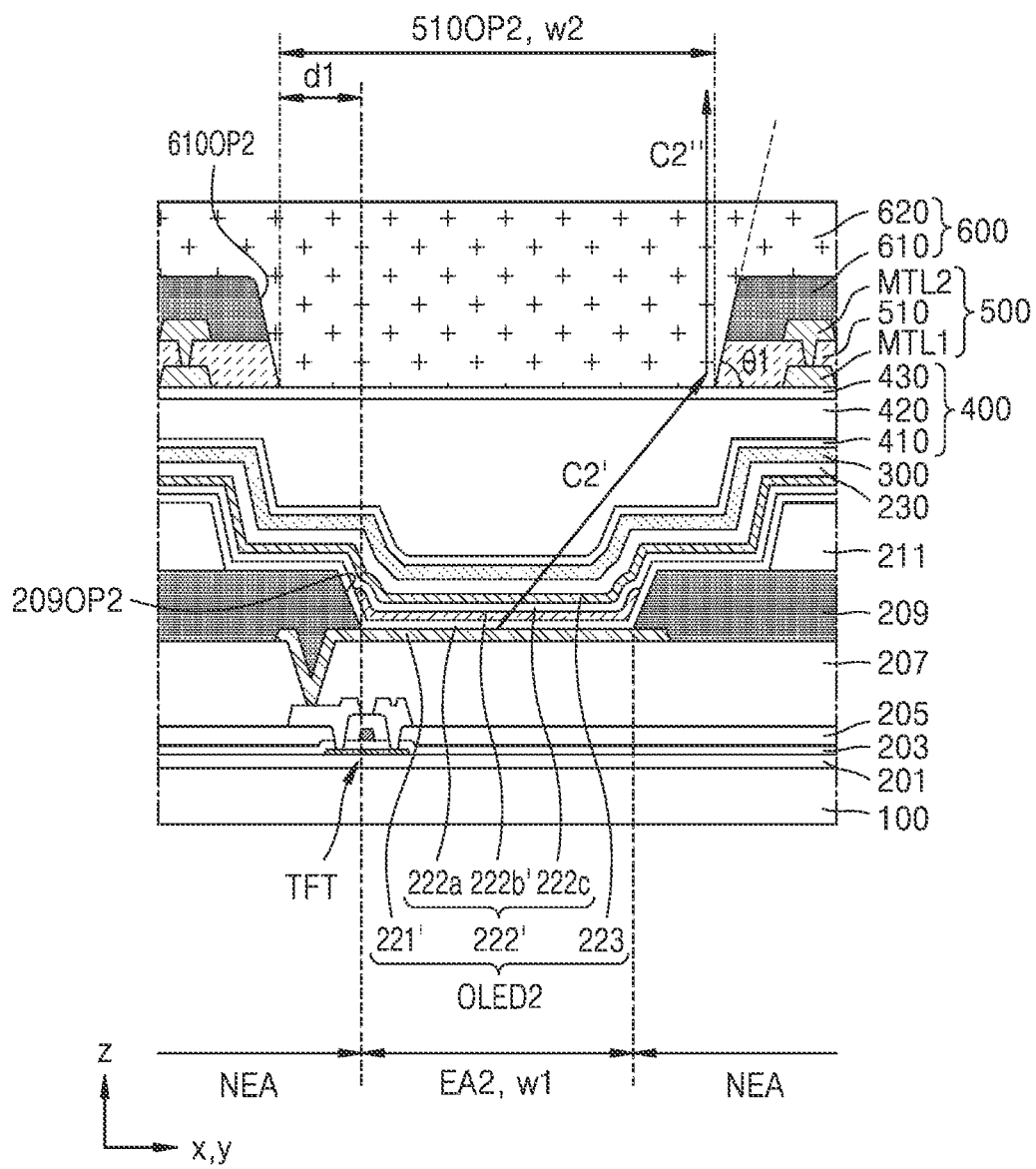
FIGS. 10 and 11 are cross-sectional views of a portion of the display apparatus shown in FIG. 9.
Figure 11:
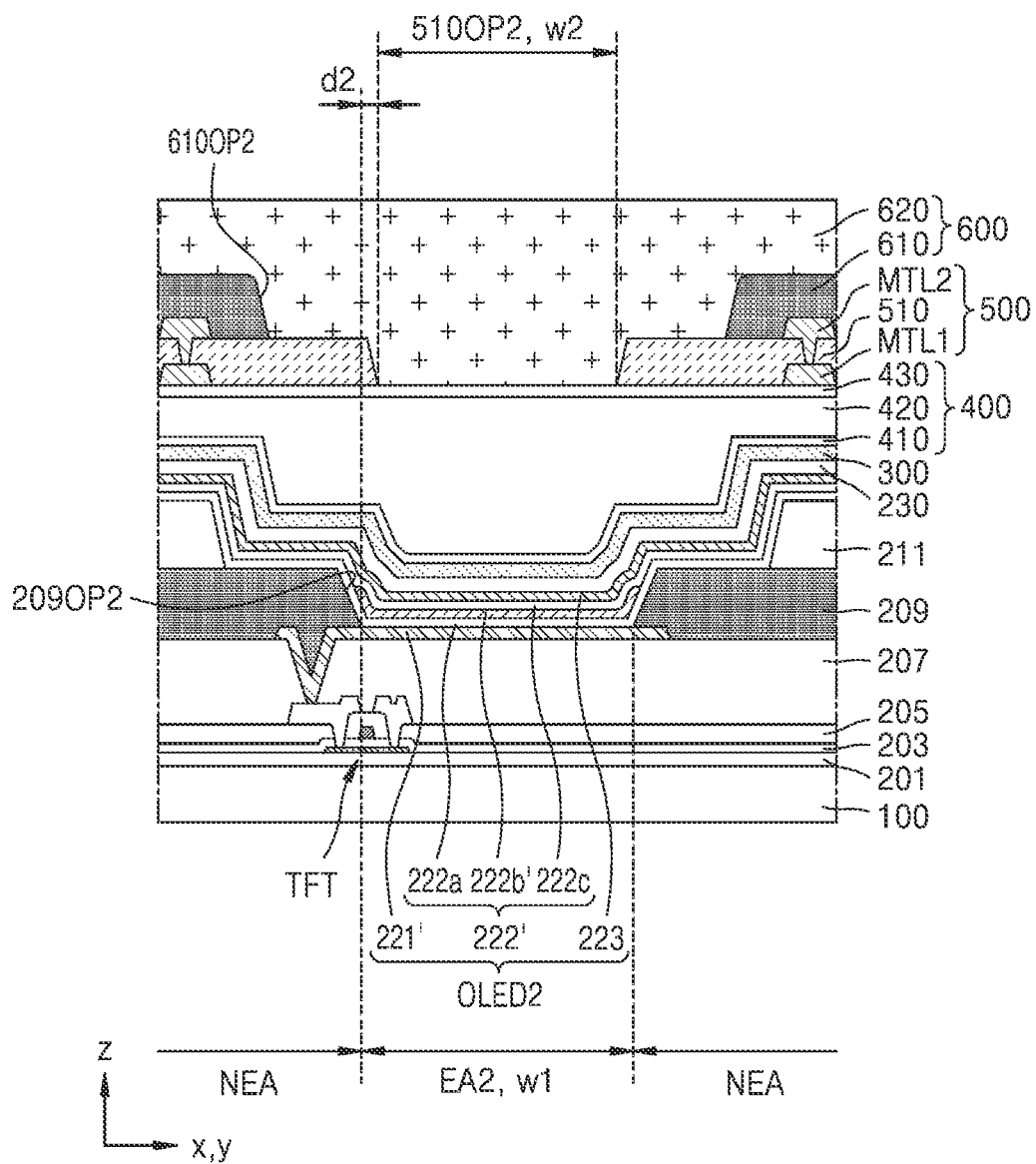

FIG. 9 is a schematic cross-sectional view of a display apparatus according to some embodiments, and FIGS. 10 and 11 are cross-sectional views of a portion of the display apparatus shown in FIG. 9. FIG. 9 is similar to FIG. 5 but different from FIG. 5 in that the second touch insulating layer 520 (see FIG. 5) of the touch sensing layer 500 is omitted, and the first touch insulating layer 510 has a less refractive index than a refractive index of the reflection-adjusting layer 620. Hereinafter, repeated description is omitted, and differences are mainly described.

Referring to FIG. 9, the display apparatus 1 according to some embodiments may include the substrate 100, the display layer 200, the low reflection layer 300, the thin-film encapsulation layer 400, the touch sensing layer 500, and the anti-reflection layer 600.

The display layer 200 may include the organic light-emitting diode OLED, the thin-film transistor TFT, the buffer layer 201, the gate insulating layer 203, the interlayer insulating layer 205, the planarization layer 207, the pixel-defining layer 209, and the spacer 211.

The organic light-emitting diode OLED may be located on the planarization layer 207, wherein the organic light-emitting diode OLED includes the first organic light-emitting diode OLED1, the second organic light-emitting diode OLED2, and the third organic light-emitting diode OLED3. The first organic light-emitting diode OLED1 may include the first pixel electrode 221, the first intermediate layer 222, and the opposite electrode 223, the second organic light-emitting diode OLED2 may include the second pixel electrode 221', the second intermediate layer 222', and the opposite electrode 223, and the third organic light-emitting diode OLED3 may include the third pixel electrode 221", the third intermediate layer 222", and the opposite electrode 223.

The pixel-defining layer 209 may be located on the first pixel electrode 221, the second pixel electrode 221', and the third pixel electrode 221". The pixel-defining layer 209 may include the first pixel opening 209OP1, the second pixel opening 209OP2, and the third pixel opening 209OP3 respectively exposing the central portions of the first pixel electrode 221, the second pixel electrode 221', and the third pixel electrode 221". The pixel-defining layer 209 may prevent arcs and the like from occurring by covering the edges of the first pixel electrode 221, the second pixel electrode 221', and the third pixel electrode 221" and increasing distances between the edges of the first pixel electrode 221, the second pixel electrode 221', and the third pixel electrode 221", and the opposite electrode 223. The first emission area EA1 may be defined by the first pixel opening 209OP1, the second emission area EA2 may be defined by the second pixel opening 209OP2, and the third emission area EA3 may be defined by the third pixel opening 209OP3.

The spacer 211 may be located on the pixel-defining layer 209. The spacer 211 may include an organic insulating material such as polyimide.

The first intermediate layer 222 may be located on the first pixel electrode 221, the first intermediate layer 222' may be located on the second pixel electrode 221', and the third intermediate layer 222" may be located on the third pixel electrode 221".

The first emission layer 222b may be located inside the first pixel opening 209OP1 of the pixel-defining layer 209 to correspond to the first pixel electrode 221. The first emission layer 222b may include an organic material including a fluorescent or phosphorous material that may emit red light. Likewise, the second emission layer 222b' may be located inside the second pixel opening 209OP2 of the pixel-defining layer 209, and the third emission layer 222b" may be located inside the third pixel opening 209OP3 of the pixel-defining layer 209. The second emission layer 222b' may include an organic material including a fluorescent or phosphorous material that may emit green light. The third emission layer 222b" may include an organic material including a fluorescent or phosphorous material that may emit blue light.

A first common layer 222a and a second common layer 222c may be located under and on the first emission layer 222b, the second emission layer 222b', and the third emission layer 222b". The first common layer 222a may include, for example, an HTL, or include an HTL and an HIL. The second common layer 222c may include, for example, an ETL, or include an ETL and an EIL. According to some embodiments, the second common layer 222c may be omitted.

The first emission layer 222b, the second emission layer 222b', and the third emission layer 222b" are patterned to respectively correspond to the first pixel opening 209OP1, the second pixel opening 209OP2, and the third pixel opening 209OP3, while the first common layer 222a and the second common layer 222c may each be formed as one body to cover the substrate 100 entirely.

The opposite electrode 223 may be located on the first intermediate layer 222. The opposite electrode 223 may include a conductive material having a low work function. Layers from the first pixel electrode 221 to the opposite electrode 223 may constitute the first organic light-emitting diode OLED1, layers from the second pixel electrode 221' to the opposite electrode 223 may constitute the second organic light-emitting diode OLED2, and layers from the third pixel electrode 221" to the opposite electrode 223 may constitute the third organic light-emitting diode OLED3.

According to some embodiments, the display apparatus 1 may further include a capping layer 230 located on the first organic light-emitting diode OLED1, the second organic light-emitting diode OLED2, and the third organic light-emitting diode OLED3. The capping layer 230 may be integrally formed to cover the substrate 100 entirely.

The low reflection layer 300 may be arranged on the capping layer 230. The low reflection layer 300 may be located on the first organic light-emitting diode OLED1, the second organic light-emitting diode OLED2, and the third organic light-emitting diode OLED3. The low reflection layer 300 may include an inorganic material having low reflectivity. According to some embodiments, the low reflection layer 300 may include metal or metal oxide. In the case where the low reflection layer 300 includes metal, the metal may include, for example, one of ytterbium (Yb), bismuth (Bi), cobalt (Co), molybdenum (Mo), titanium (Ti), zirconium (Zr), aluminum (Al), chrome (Cr), niobium (Nb), platinum (Pt), tungsten (W), indium (In), tin (Sn), iron (Fe), nickel (Ni), tantalum (Ta), manganese (Mn), zinc (Zn), germanium (Ge), silver (Ag), magnesium (Mg), gold (Au), copper (Cu), calcium (Ca), and a combination thereof. In addition, in the case where the low reflection layer 300 includes metal oxide, the metal oxide may include, for example, one of $SiO_2$, $TiO_2$, $ZrO_2$, $Ta_2O_5$, $HfO_2$, $Al_2O_3$, ZnO, $Y_2O_3$, BeO, MgO, $PbO_2$, $WO_3$, $SiN_x$, LiF, $CaF_2$, $MgF_2$, CdS, and a combination thereof.

According to some embodiments, an absorption coefficient k of an inorganic material of the low reflection layer 300 may be 4.0 or less and greater than 0.5 ($0.5 < k \leq 4.0$). In addition, an inorganic material of the low reflection layer 300 may have a refractive index n of 1 or more ($n \geq 1.0$).

The low reflection layer 300 may reduce external light reflectivity by inducing light incident to the inside of the display apparatus 1 to destructively interfere with light reflected by a metal located below the low reflection layer 300. Accordingly, because external light reflectivity is reduced by the low reflection layer 300, the display quality and visibility of the display apparatus 1 may be improved.

Though FIG. 9 shows a structure in which the low reflection layer 300 is located on the entire surface of the substrate 100 as the opposite electrode 223 and the capping layer 230, the embodiments according to the present disclosure are not limited thereto. As an example, the low reflection layer 300 may be patterned for each pixel.

The thin-film encapsulation layer 400 may be located on the low reflection layer 300. The thin-film encapsulation layer 400 may include at least one inorganic encapsulation layer and at least one organic encapsulation layer. As an example, the thin-film encapsulation layer 400 may include a first inorganic encapsulation layer 410, an organic encapsulation layer 420, and a second inorganic encapsulation layer 430 that are sequentially stacked.

The touch sensing layer 500 may be located on the thin-film encapsulation layer 400. The touch sensing layer 500 may include the first touch electrode layer MTL1, the first touch insulating layer 510, and the second touch electrode layer MTL2. The first touch electrode layer MTL1 may be directly located on the thin-film encapsulation layer 400. In this case, the first touch electrode layer MTL1 may be directly located on the second inorganic encapsulation layer 430 of the thin-film encapsulation layer 400. However, the embodiments according to the present disclosure are not limited thereto. As an example, the touch sensing layer 500 may include an insulating layer between the first touch electrode layer MTL1 and the thin-film encapsulation layer 400.

According to some embodiments, the second touch electrode layer MTL2 may be located on the first touch electrode layer MTL1. The second touch electrode layer MTL2 may serve as a touch electrode configured to a user's touch input. The first touch electrode MTL1 may serve as a connection electrode connecting, in one direction, the second touch electrode MTL2 that is patterned. According to some embodiments, both the first touch electrode layer MTL1 and the second touch electrode layer MTL2 may serve as sensors. The first touch electrode layer MTL1 may be electrically connected to the second touch electrode layer MTL2 through a contact hole passing through the first touch insulating layer 510.

According to some embodiments, the first touch electrode layer MTL1 and the second touch electrode layer MTL2 may each have, for example, a mesh structure such that light emitted from the first organic light-emitting diodes OLED1, the second organic light-emitting diodes OLED2, and the third organic light-emitting diodes OLED3 passes therethrough. In this case, the first touch electrode layer MTL1 and the second touch electrode layer MTL2 may each be arranged in a non-emission area NEA not to overlap the first emission area EA1, the second emission area EA2, and the third emission area EA3.

The first touch insulating layer 510 may be located between the first touch electrode layer MTL1 and the second touch electrode layer MTL2. The first touch insulating layer 510 may include an organic material layer including dye, pigment, or a combination thereof configured to absorb some wavelength bands of visible light. As an example, the first touch insulating layer 510 may be formed by coating polymer in which dye, pigment, and a combination thereof having a red component are uniformly dispersed. The first touch insulating layer 510 may transmit first light L1 of a red color emitted from the first organic light-emitting diode OLED1 and absorb light in wavelengths except for red light, thereby implementing red light of high color purity.

The first touch insulating layer 510 may include C.I pigment red 177, C.I pigment red 254, C.I pigment yellow 150, C.I pigment yellow 138, or a combination thereof. However, the embodiments according to the present disclosure are not limited thereto.

As an example, the first touch insulating layer 510 may include a compound represented by one of Chemical Formulas 1 to 4 below. Chemical Formulas 1 to 4 may each have a structure of C.I pigment red 177, C.I pigment red 254, C.I pigment yellow 150, or C.I pigment yellow 138. Chemical Formulas 1 to 4 are provided as examples and the embodiments according to the present disclosure are not limited thereto.

Chemical Formula 1

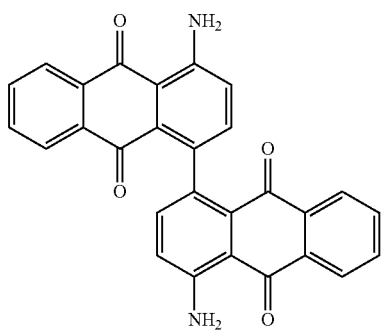

Chemical Formula 2

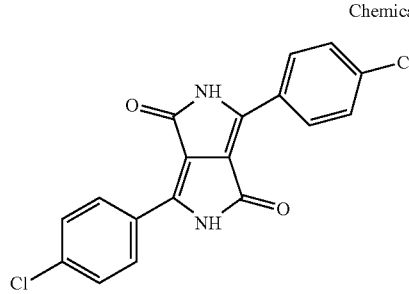

Chemical Formula 3

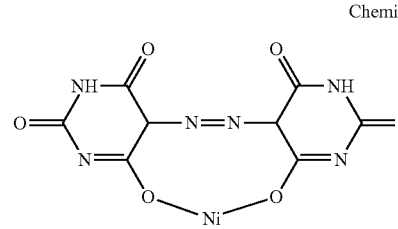

Chemical Formula 4

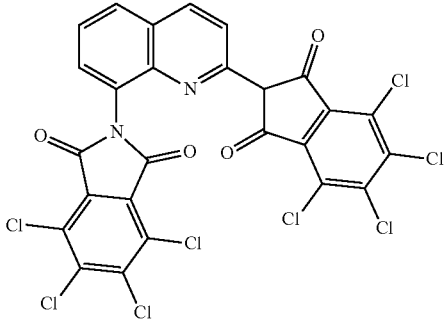

The first touch insulating layer 510 is a base polymer and may include polyethylene terephthalate, polyethylene naphthalate, polycarbonate, polyimide, polyethylene sulfonate, polyoxymethylene, polyarylate, hexamethyldisiloxane, an acryl-based resin (e.g., polymethylmethacrylate, poly acrylic acid, etc.), or an arbitrary combination thereof.

The first touch insulating layer 510 may overlap the first emission area EA1 of the first organic light-emitting diode OLED1 and may not overlap the second emission area EA2 of the second organic light-emitting diode OLED2 and the third emission area EA3 of the third organic light-emitting diode OLED3. In other words, the first touch insulating layer 510 may include the fourth opening 510OP2 and the fifth opening 510OP3, wherein the fourth opening 510OP2 overlaps the second pixel opening 209OP2 of the pixel-defining layer 209, and the fifth opening 510OP3 overlaps the third pixel opening 209OP3. Accordingly, the second light L2 of a red color emitted from the second organic light-emitting diode OLED2, and the third light L3 of a blue color emitted from the third organic light-emitting diode OLED3 may not pass through the first touch insulating layer 510 but may be emitted as they are.

According to some embodiments, as shown in FIG. 10, a second width w2 of the fourth opening 510OP2 of the first touch insulating layer 510 may be greater than a first width w1 of the second emission area EA2 of the second organic light-emitting diode OLED2. In this case, a distance d1 from a boundary of the second pixel opening 209OP2 of the pixel-defining layer 209 to a boundary of the fourth opening 510OP2 of the first touch insulating layer 510 may be 2 μm or less. According to some embodiments, the lateral wall of the first touch insulating layer 510 defining the fourth opening 510OP2 may have a tapered angle of the first angle θ1 with respect to the upper surface of the substrate 100. According to some embodiments, the first angle θ1 may be about 70° to about 88°. The first angle θ1 may be about 70° to about 85°.

According to some embodiments, as shown in FIG. 11, the second width w2 of the fourth opening 510OP2 of the first touch insulating layer 510 may be less than or substantially the same as the first width w1 of the second emission area EA2 of the second organic light-emitting diode OLED2. In this case, a distance d2 from a boundary of the second pixel opening 209OP2 of the pixel-defining layer 209 to a boundary of the fourth opening 510OP2 of the first touch insulating layer 510 may be 1 μm or less.

Though FIGS. 10 and 11 mainly describe the second organic light-emitting diode OLED2, the third organic light-emitting diode OLED3 and the touch sensing layer 500 and the anti-reflection layer 600 on the third organic light-emitting diode OLED3 may have a structure which is the same as or similar to a structure described with reference to FIGS. 10 and 11.

According to some embodiments, the first touch insulating layer 510 may include an organic insulating material of a refractive index. As an example, the refractive index of the first touch insulating layer 510 may be about 1.5 or 1.5 or less.

The anti-reflection layer 600 may be located on the touch sensing layer 500. The anti-reflection layer 600 may include the light-blocking layer 610 and a reflection-adjusting layer 620. The light-blocking layer 610 may be directly located on the second touch electrode layer MTL2.

The light-blocking layer 610 may include the first opening 610OP1 overlapping the first emission area EA1 of the first organic light-emitting diode OLED1, the second opening 610OP2 overlapping the second emission area EA2 of the second organic light-emitting diode OLED2, and the third opening 6100P3 overlapping the third emission area EA3 of the third organic light-emitting diode OLED3.

The width (or the area) of the first opening 610OP1 of the light-blocking layer 610 may be greater than or equal to the width (or the area) of the first pixel opening 209OP1, the width (or the area) of the second opening 610OP2 may be greater than or equal to the width (or the area) of the second pixel opening 209OP2, and the width (or the area) of the third opening 610OP3 may be greater than or equal to the width (or the area) of the third pixel opening 209OP3. Accordingly, a body portion of the light-blocking layer 610 may overlap a body portion of the pixel-defining layer 209. In other words, the body portion of the light-blocking layer 610 may be located in only the non-emission area NEA. The body portion of the light-blocking layer 610 is a portion outside the first opening 610OP1, the second opening 610OP2, and the third opening 610OP3, and denotes a portion having a preset volume (a thickness). Likewise, the body portion of the pixel-defining layer 209 is a portion outside the first pixel opening 209OP1, the second pixel opening 209OP2, and the third pixel opening 209OP3, and denotes a portion having a preset volume (a thickness).

According to some embodiments, the width (or the area) of the second opening 610OP2 of the light-blocking layer 610 may be greater than or equal to the width (the area) of the fourth opening 510OP2 of the first touch insulating layer 510, and the width (or the area) of the third opening 610OP3 of the light-blocking layer 610 may be greater than or equal to the width (the area) of the fifth opening 510OP3 of the first touch insulating layer 510.

The light-blocking layer 610 may include an organic insulating material. According to some embodiments, the light-blocking layer 610 may include a light-blocking material and be provided in black. In this case, to prevent or reduce damage to the second touch electrode layer MTL2 during a process of developing the light-blocking layer 610, the light-blocking layer 610 may include tetramethyl ammonium hydroxide (TAMH) developing solution-based photosensitive polymer.

The reflection-adjusting layer 620 may be located on the light-blocking layer 610. The reflection-adjusting layer 620 may selectively absorb light in some wavelength bands among light reflected from the display apparatus or light incident from the outside of the display apparatus. The reflection-adjusting layer 620 may absorb light of a wavelength deviating from an emission wavelength range of red, green, or blue of the first organic light-emitting diode OLED1, the second organic light-emitting diode OLED2, and the third organic light-emitting diode OLED3. Because the reflection-adjusting layer 620 absorbs light of the wavelength deviating from the emission wavelength range of red, green, or blue of the first organic light-emitting diode OLED1, the second organic light-emitting diode OLED2, and the third organic light-emitting diode OLED3, reduction in the brightness of the display apparatus may be prevented or reduced, and simultaneously, reduction in a light-emission efficiency of the display apparatus may be prevented or reduced, and visibility may be improved.

According to some embodiments, the reflection-adjusting layer 620 may have a higher refractive index than a refractive index of the first touch insulating layer 510. As an example, a difference in the refractive index between the first touch insulating layer 510 and the reflection-adjusting layer 620 may be 0.1 or more. According to some embodiments, a refractive index n of the reflection-adjusting layer 620 may be 1.6 or more. Accordingly, as shown in FIG. 10, second light L2 progressing along a first path C1 inclined from a direction (a z direction) perpendicular to the substrate 100 may be refracted at the interface between the reflection-adjusting layer 620 and the second touch insulating layer 520 and may progress in a second path C2 in a direction (the z direction) perpendicular to the substrate 100. Accordingly, lateral brightness of the second light L2 may be adjusted. Likewise, lateral brightness of third light L3 may be also adjusted by a difference in the refractive index between the reflection-adjusting layer 620 and the second touch insulating layer 520. A color sense of the display apparatus according to a slope may be adjusted by adjusting the lateral brightness of the second light L2 and the third light L3.

Figure 12A:
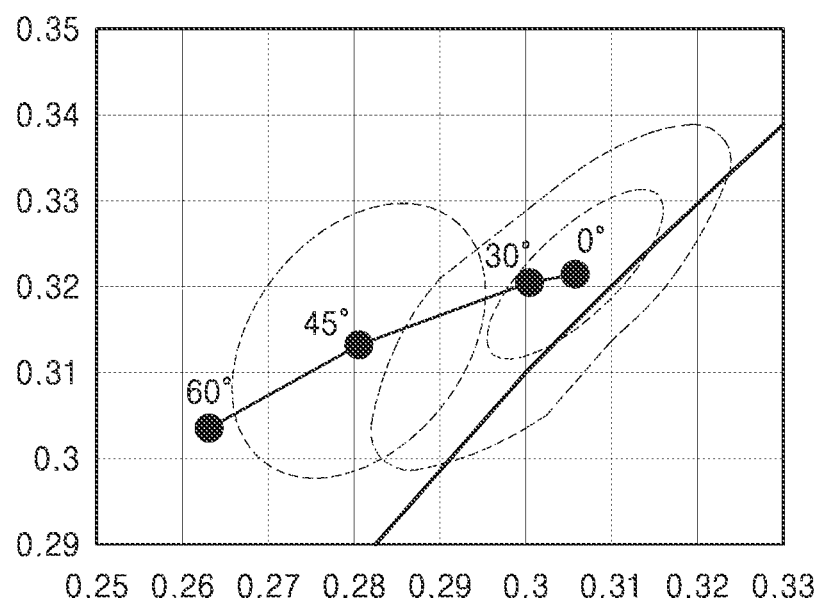
FIGS. 12A and 12B are graphs showing color coordinates according to measurement angles of white light of a display apparatus according to a comparative example and a display apparatus according to some embodiments.
Figure 12B:
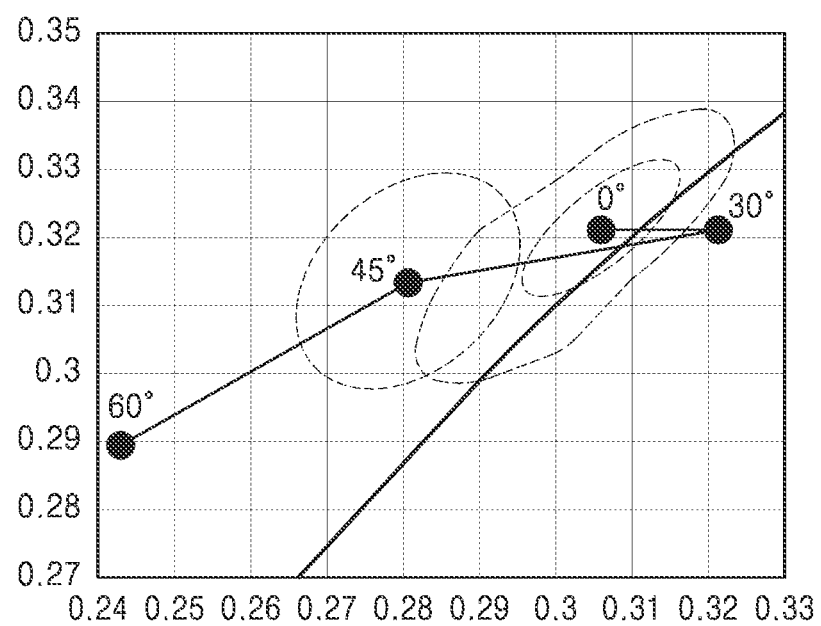

FIGS. 12A and 12B are graphs showing color coordinates according to measurement angles of white light of a display apparatus according to a comparative example and the display apparatus 1 according to some embodiments. Color coordinates of FIGS. 12A and 12B show an enlarged portion of a region of CIE 1931 XYZ color coordinates, and an angle was measured with respect to the direction (the z direction) perpendicular to the upper surface of the display apparatus.

A display apparatus according to a comparative example is similar to the display apparatus described with reference to FIG. 9, but the first touch insulating layer includes a light-transmissive organic material not including dye, pigment, or a combination thereof, and is formed without an opening to cover the first organic light-emitting diode OLED1, the second organic light-emitting diode OLED2, and the third organic light-emitting diode OLED3. In addition, a difference in the refractive index between the reflection-adjusting layer and the first touch insulating layer is 0.1 or less.

Referring to FIG. 12A, when color coordinates of white light of the display apparatus according to a comparative example are measured at an angle of 30° in the direction (the z direction) perpendicular to the upper surface of the substrate, it may be determined that an x value of the color coordinates increases by about 0.15. In the comparative example, because the low reflection layer is provided, resonance of red light is reinforced and images of the display apparatus at low angles (30° or less) are viewed red. Therefore, the aesthetics of the display apparatus may be deteriorated.

Referring to FIG. 12B, because the display apparatus according to some embodiments may be configured to adjust the lateral brightness of green light and blue light due to a difference in the refractive index between the first touch insulating layer 510 (see FIG. 9) and the reflection-adjusting layer 620 (see FIG. 9), images of the display apparatus may be prevented or reduced from being viewed red at low angles. In addition, compared to a structure in which a polarizer is adopted, a light-emission efficiency is improved by about 123% in a comparative example. In contrast, compared to the structure in which a polarizer is adopted, a light-emission efficiency is improved by about 145% according to some embodiments.

Figure 13A:
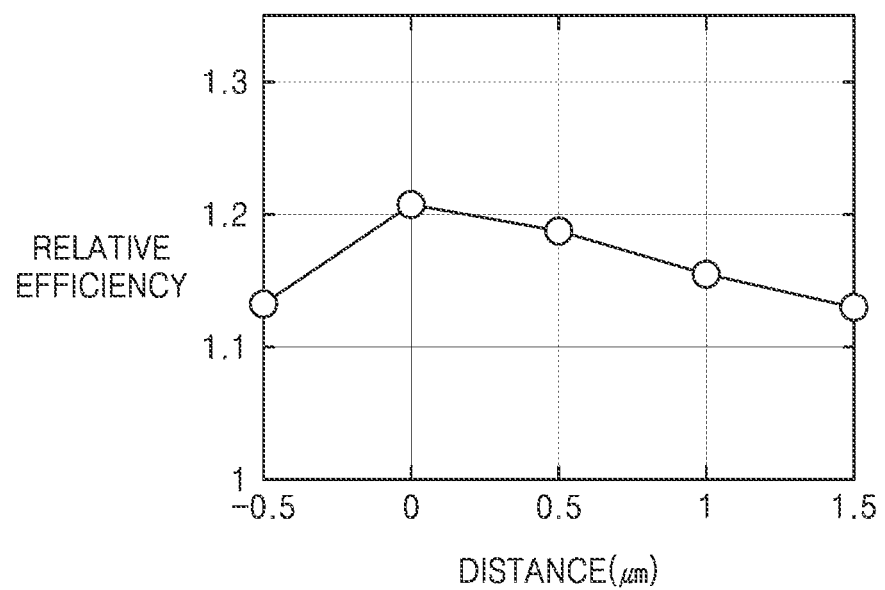
FIGS. 13A to 13C are graphs showing a relative efficiency for each pixel of a display apparatus according to distances between a boundary of a pixel opening of a pixel-defining layer and a boundary of an opening of a first touch insulating layer.
Figure 13B:
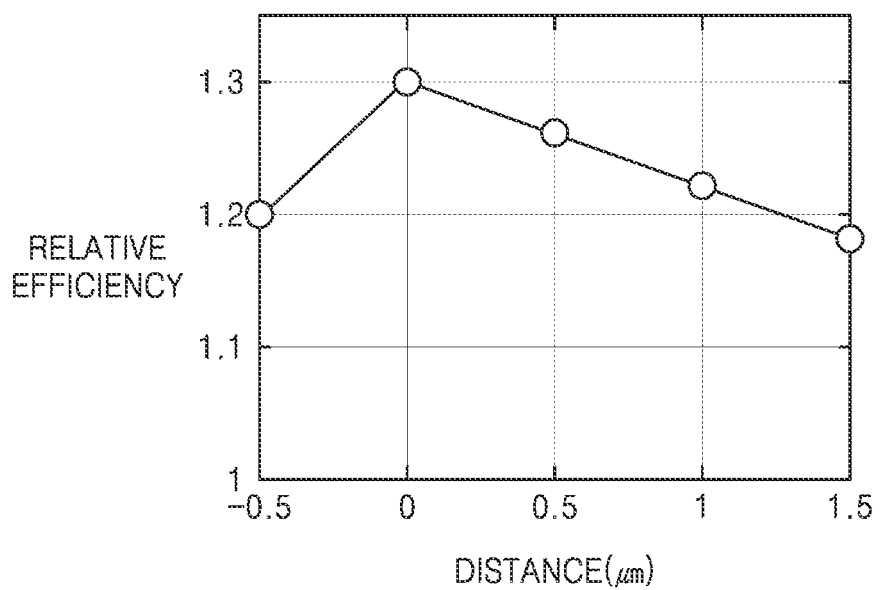
Figure 13C:
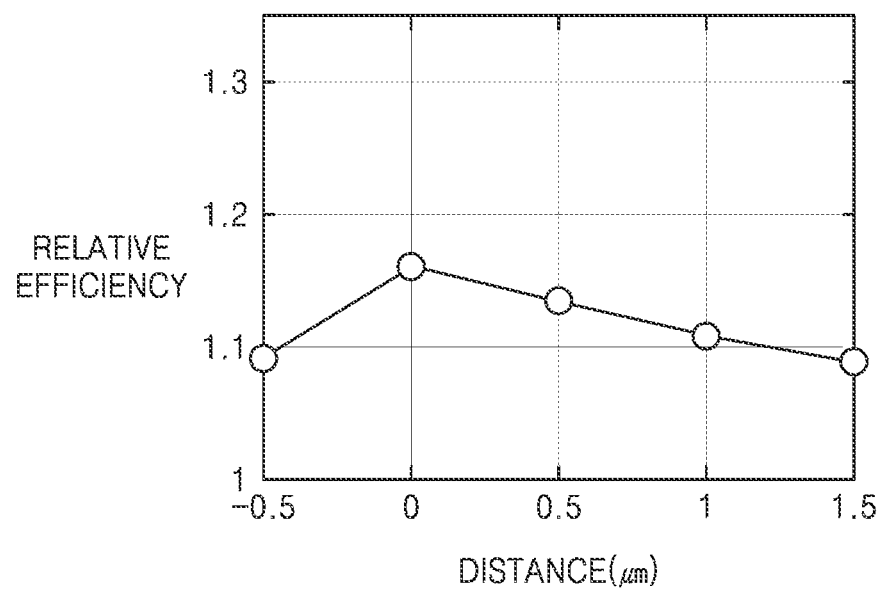

FIGS. 13A to 13C are graphs showing a relative efficiency for each pixel of a display apparatus according to distances between a boundary of a pixel opening of a pixel-defining layer and a boundary of an opening of a first touch insulating layer. Here, a relative efficiency is defined as a simulation of a front emission efficiency for each pixel of the display apparatus according to some embodiments when the front emission efficiency for each pixel of the display apparatus including a polarizer is defined as 1. FIG. 13A shows a relative efficiency of a red pixel, FIG. 13B shows a relative efficiency of a green pixel, and FIG. 13C shows a relative efficiency of a blue pixel.

When a distance between the boundary of the pixel opening and the boundary of the opening of the first touch insulating layer has a negative value or 0, it means that the second width w2 of the fourth opening 510OP2 of the first touch insulating layer 510 is less than or substantially the same as the first width w1 of the second emission area EA2 as described above with reference to FIG. 11. When a distance between the boundary of the pixel opening and the boundary of the opening of the first touch insulating layer has a positive value, it means that the second width w2 of the fourth opening 510OP2 of the first touch insulating layer 510 is greater than the first width w1 of the second emission area EA2 as described above with reference to FIG. 10.

Referring to FIGS. 13A to 13C, in the display apparatus according to some embodiments, when a distance between the boundary of the pixel opening and the boundary of the opening of the first touch insulating layer is about −0.5 µm to about 1.5 µm, it is known that a relative efficiency is improved compared to the structure in which the polarizer is adopted. Considering changes in the thickness and the like of the layers located between the pixel-defining layer and the touch insulating layer, when a distance between the boundary of the pixel opening and the boundary of the opening of the first touch insulating layer is about −1 µm to about 2 µm, a high emission efficiency may be achieved compared to the structure in which the polarizer is adopted.

Figure 14:
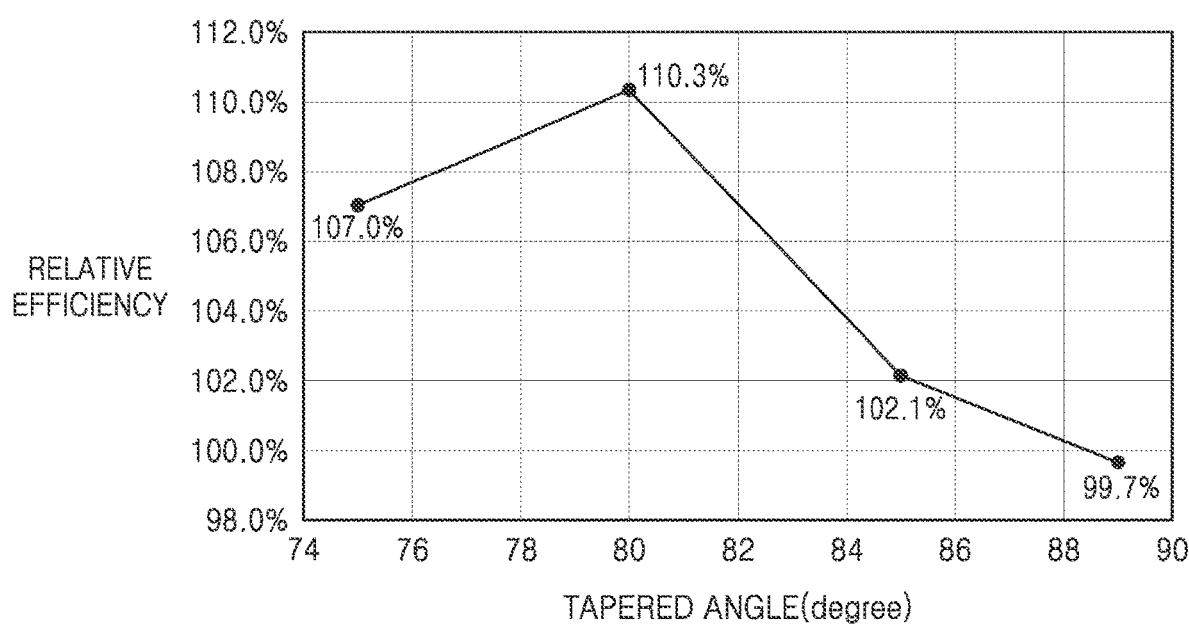
FIG. 14 is a graph showing a relative efficiency of a display apparatus according to tapered angles of a first touch insulating layer.

FIG. 14 is a graph showing a relative efficiency of the display apparatus according to tapered angles of a first touch insulating layer. Here, the tapered angle is the first angle θ1 formed between the lateral wall of the first touch insulating layer 510 defining the fourth opening 510OP2 and the upper surface of the substrate 100 as shown in FIG. 10. The relative efficiency is defined as a simulation of an emission efficiency of the display apparatus according to some embodiments when an emission efficiency of the structure in which the polarizer is adopted is defined as 100%.

Referring to FIG. 14, it is determined that, when a tapered angle of the first touch insulating layer is about 75°, a relative efficiency is 107.0%, when a tapered angle is about 80°, a relative efficiency is 110.3%, and when a tapered angle is about 85°, a relative efficiency is 102.1%. From the simulation results, it was determined that, when a tapered angle of the first touch insulating layer is about 75° to about 88°, the display apparatus according to some embodiments may have a high emission efficiency compared to the structure in which the polarizer is adopted. Considering changes in the thickness and the like of the layers located between the pixel-defining layer and the touch insulating layer, a tapered angle may be about 70° to about 85°.

According to some embodiments, a display apparatus with improved visibility may be implemented. However, the scope of embodiments according to the present disclosure is not limited by this effect.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, and their equivalents.

What is claimed is:

1. A display apparatus comprising:
    a first light-emitting element on a substrate and configured to implement a first emission area by emitting light in a first wavelength band;
    a second light-emitting element on the substrate and configured to implement a second emission area by emitting light in a second wavelength band that is different from the first wavelength band;
    a low reflection layer on the first light-emitting element and the second light-emitting element and including an inorganic material;
    a touch sensing layer on the low reflection layer and including a first touch electrode layer, a second touch electrode layer, a first touch insulating layer between the first touch electrode layer and the second touch electrode layer, and a second touch insulating layer on the second touch electroe, wherein the first touch insulating layer covers the first emission area and includes a first opening overlapping the second emission area, and the second touch insulating layer covers the first emission area and includes a second opening overlapping the first opening;
    a light-blocking layer on the touch sensing layer and including a third opening corresponding to the first emission area and a fourth opening corresponding to the second emission area; and
    a reflection-adjusting layer on the light-blocking layer wherein a refractive index of the reflection-adjusting layer is higher than a refractive index of the second touch insulating layer.

2. The display apparatus of claim 1, wherein the first light-emitting element is configured to emit red light.

3. The display apparatus of claim 1, wherein the first touch insulating layer is configured to selectively transmit the light in the first wavelength band.

4. The display apparatus of claim 1, wherein the reflection-adjusting layer fills the first opening and the second opening.

5. The display apparatus of claim 1, wherein a difference between the refractive index of the reflection-adjusting layer and the refractive index of the second touch insulating layer is 0.1 or more.

6. The display apparatus of claim 5, wherein the refractive index of the second touch insulating layer is 1.5 or less, and the refractive index of the reflection-adjusting layer is 1.6 or more.

7. The display apparatus of claim 1, wherein the reflection-adjusting layer includes dye, pigment, or a combination thereof.

8. The display apparatus of claim 1, wherein the first light-emitting element includes a first pixel electrode, the second light-emitting element includes a second pixel electrode, the display apparatus further includes a pixel-defining layer covering edges of the first pixel electrode and the second pixel electrode and defining a first pixel opening corresponding to the first emission area and a second pixel opening corresponding to the second emission area, and the pixel-defining layer includes a light-blocking material.

9. The display apparatus of claim 8, wherein a width of the first opening is greater than a width of the second pixel opening, and a first distance between a boundary of the first opening and a boundary of the second pixel opening is 2 µm or less.

10. The display apparatus of claim 8, wherein a width of the first opening is less than or equal to a width of the second pixel opening, and a second distance between a boundary of the first opening and a boundary of the second pixel opening is 1 µm or less.

11. The display apparatus of claim 1, wherein a lateral surface of the first touch insulating layer defining the first opening has a slope in a range of 70° to 88° with respect to an upper surface of the substrate.

12. A display apparatus comprising:
a first light-emitting element on a substrate and configured to implement a first emission area by emitting light in a first wavelength band;
a second light-emitting element on the substrate and configured to implement a second emission area by emitting light in a second wavelength band that is different from the first wavelength band;
a low reflection layer on the first light-emitting element and the second light-emitting element and including an inorganic material;
a touch sensing layer on the low reflection layer and including a first touch electrode layer, a second touch electrode layer, and a touch insulating layer between the first touch electrode layer and the second touch electrode layer, wherein the touch insulating layer covers the first emission area and includes a first opening overlapping the second emission area;
a light-blocking layer on the touch sensing layer and including a second opening corresponding to the first emission area and a third opening corresponding to the second emission area; and
a reflection-adjusting layer on the light-blocking layer wherein a refractive index of the reflection-adjusting layer is higher than a refractive index of the touch insulating layer.

13. The display apparatus of claim 12, wherein the first light-emitting element is configured to emit red light.

14. The display apparatus of claim 12, wherein the touch insulating layer is configured to selectively transmit the light in the first wavelength band.

15. The display apparatus of claim 12, wherein a difference between the refractive index of the reflection-adjusting layer and the refractive index of the touch insulating layer is 0.1 or more.

16. The display apparatus of claim 12, wherein the reflection-adjusting layer includes dye, pigment, or a combination thereof.

17. The display apparatus of claim 12, wherein the first light-emitting element includes a first pixel electrode, the second light-emitting element includes a second pixel electrode, the display apparatus further includes a pixel-defining layer covering edges of the first pixel electrode and the second pixel electrode and defining a first pixel opening corresponding to the first emission area and a second pixel opening corresponding to the second emission area, and the pixel-defining layer includes a light-blocking material.

18. The display apparatus of claim 17, wherein a width of the first opening is greater than a width of the second pixel opening, and a first distance between a boundary of the first opening and a boundary of the second pixel opening is 2 µm or less.

19. The display apparatus of claim 17, wherein a width of the first opening is less than or equal to a width of the second pixel opening, and a second distance between a boundary of the first opening and a boundary of the second pixel opening is 1 µm or less.

20. The display apparatus of claim 12, wherein a lateral surface of the touch insulating layer defining the first opening has a slope in a range of 70° to 88° with respect to an upper surface of the substrate.

* * * * *